(12) United States Patent
Han et al.

(10) Patent No.: US 9,893,244 B2
(45) Date of Patent: Feb. 13, 2018

(54) OPTOELECTRONIC ELEMENT

(71) Applicant: EPISTAR CORPORATION, Hsinchu (TW)

(72) Inventors: Cheng-Nan Han, Hsinchu (TW);
Tsung-Xian Lee, Hsinchu (TW);
Min-Hsun Hsieh, Hsinchu (TW);
Hung-Hsuan Chen, Hsinchu (TW);
Hsin-Mao Liu, Hsinchu (TW);
Hsing-Chao Chen, Hsinchu (TW);
Ching San Tao, Hsinchu (TW);
Chih-Peng Ni, Hsinchu (TW);
Tzer-Perng Chen, Hsinchu (TW);
Jen-Chau Wu, Hsinchu (TW);
Masafumi Sano, Hsinchu (TW);
Chih-Ming Wang, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 14/858,477

(22) Filed: Sep. 18, 2015

(65) Prior Publication Data
US 2016/0013371 A1 Jan. 14, 2016

Related U.S. Application Data

(63) Continuation of application No. 13/886,083, filed on May 2, 2013, now Pat. No. 9,142,740, which is a
(Continued)

(51) Int. Cl.
*H01L 33/50* (2010.01)
*H01L 33/58* (2010.01)
(Continued)

(52) U.S. Cl.
CPC .......... *H01L 33/502* (2013.01); *H01L 33/387* (2013.01); *H01L 33/44* (2013.01);
(Continued)

(58) Field of Classification Search
CPC ................. H01L 33/62; H01L 33/58; H01L 2224/48091; H01L 33/50; H01L 33/20; H01L 33/46; H01L 33/405; H01L 33/32
See application file for complete search history.

(56) References Cited

U.S. PATENT DOCUMENTS 6,486,499 B1 * 11/2002 Krames .................. H01L 33/025
257/103
6,946,309 B2 * 9/2005 Camras .................. H01L 33/02
257/E33.07
(Continued)

FOREIGN PATENT DOCUMENTS

JP 2005-252222 A 9/2005
WO 2006035664 A1 4/2006

*Primary Examiner* — Ermias Woldegeorgis
(74) *Attorney, Agent, or Firm* — Ditthavong & Steiner, P.C.

(57) ABSTRACT

An optoelectronic element includes an optoelectronic unit, a first metal layer, a second metal layer, a conductive layer and a transparent structure. The optoelectronic unit has a central line in a top view, a top surface, and a bottom surface. The second metal layer is formed on the top surface, and has an extension portion crossing over the central line and extending to the first metal layer. The conductive layer covers the first metal layer and the extension portion. The transparent structure covers the bottom surface without covering the top surface.

13 Claims, 26 Drawing Sheets

Related U.S. Application Data continuation-in-part of application No. 11/674,371, filed on Feb. 13, 2017, now abandoned, which is a continuation-in-part of application No. 11/249,680, filed on Oct. 12, 2005, now Pat. No. 7,192,797, application No. 14/858,477, which is a continuation-in-part of application No. 12/840,848, filed on Jul. 21, 2010, now Pat. No. 8,999,736, which is a continuation-in-part of application No. 11/160,588, filed on Jun. 29, 2005, now Pat. No. 7,928,455, which is a continuation-in-part of application No. 10/604,245, filed on Jul. 4, 2003, now Pat. No. 6,987,287.

(51) Int. Cl.
*H01L 33/62* (2010.01)
*H01L 33/38* (2010.01)
*H01L 33/44* (2010.01)
*H01L 33/46* (2010.01)
*H01L 33/54* (2010.01)
*H01L 33/64* (2010.01)

(52) U.S. Cl.
CPC .............. *H01L 33/46* (2013.01); *H01L 33/58* (2013.01); *H01L 33/62* (2013.01); *H01L 33/38* (2013.01); *H01L 33/50* (2013.01); *H01L 33/54* (2013.01); *H01L 33/647* (2013.01); *H01L 2224/19* (2013.01); *H01L 2224/48091* (2013.01); *H01L 2224/73265* (2013.01); *H01L 2933/005* (2013.01); *H01L 2933/0066* (2013.01)

(56) References Cited

U.S. PATENT DOCUMENTS

| | | | |
|---|---|---|---|
| 7,166,483 B2* | 1/2007 | Liu | H01L 33/38 257/E33.068 |
| 8,368,100 B2 | 2/2013 | Donofrio et al. | |
| 8,556,672 B2 | 10/2013 | Imazu | |
| 8,823,031 B2 | 9/2014 | Kususe et al. | |
| 9,184,357 B2 | 11/2015 | Sugizaki et al. | |
| 2001/0032985 A1* | 10/2001 | Bhat | H01L 25/0753 257/88 |
| 2002/0185965 A1* | 12/2002 | Collins, III | H01L 33/505 313/501 |
| 2005/0161693 A1 | 7/2005 | Sugiura et al. | |
| 2006/0261364 A1 | 11/2006 | Suehiro et al. | |
| 2008/0237828 A1 | 10/2008 | Yang | |
| 2008/0315236 A1 | 12/2008 | Lu et al. | |
| 2009/0057699 A1* | 3/2009 | Basin | H01L 33/56 257/98 |

\* cited by examiner

OPTOELECTRONIC ELEMENT

RELATED APPLICATION

This application is a continuation application of U.S. patent application of Ser. No. 13/886,083, filed on May 2, 2013, which is a continuation-in-part application of U.S. patent application of Ser. No. 11/674,371, filed on Feb. 13, 2007, which is a continuation-in-part application of U.S. patent application of Ser. No. 11/249,680, filed on Oct. 12, 2005, and the contents of which are incorporated herein by reference in their entireties.

This application is a continuation-in-part application of Ser. No. 12/840,848, filed Jul. 21, 2010, which is a continuation-in-part application of Ser. No. 11/160,588, filed Jun. 29, 2005, which is a continuation-in-part application of Ser. No. 10/604,245, filed Jul. 4, 2003, and claims the right of priority based on Taiwan application Ser. No. 098124681, filed Jul. 21, 2009, and Taiwan application Ser. No. 098146171, filed Dec. 30, 2009, and the content of which is hereby incorporated by reference in their entireties.

This application claims the right of priority based on Taiwan application Ser. No. 101115716, filed May 2, 2012, and the content of which is hereby incorporated by reference in its entirety.

This application claims the right of priority based on Taiwan application Ser. No. 101128707, filed Aug. 8, 2012, and the content of which is hereby incorporated by reference in its entirety.

BACKGROUND

Technical Field

The present disclosure relates to an optoelectronic element, and more particularly, to an optoelectronic element having a conductive structure.

Description of the Related Art

An optoelectronic element, such as a light-emitting diode (LED) package, has been applied widely in optical display devices, traffic signals, data storing devices, communication devices, illumination devices, and medical apparatuses. Similar to the trend of small and slim commercial electronic product, the development of the optoelectronic element also enters into an era of miniature package. One promising packaging design for semiconductor and optoelectronic element is the Chip-Level Package (CLP).

The LED can be further packaged and connected with other elements to form a light-emitting device. FIG. 15 shows a schematic view of a conventional light-emitting device structure. A conventional light-emitting device 150 includes a submount 152 with a circuit 154; a solder 156 on the submount 152, wherein an LED 151 is adhesively fixed on the submount 152 by the solder 156; and an electrical-connecting structure 158 electrically connecting the electrode 155 with the circuit 154. The submount 152 can be a lead frame or a mounting substrate for circuit design and heat dissipation of the light-emitting device 150.

SUMMARY OF THE DISCLOSURE

An optoelectronic element includes an optoelectronic unit, a first metal layer, a second metal layer, a conductive layer and a transparent structure. The optoelectronic unit has a central line in a top view, a top surface, and a bottom surface. The second metal layer is formed on the top surface, and has an extension portion crossing over the central line and extending to the first metal layer. The conductive layer covers the first metal layer and the extension portion. The transparent structure covers the bottom surface without covering the top surface.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1A:
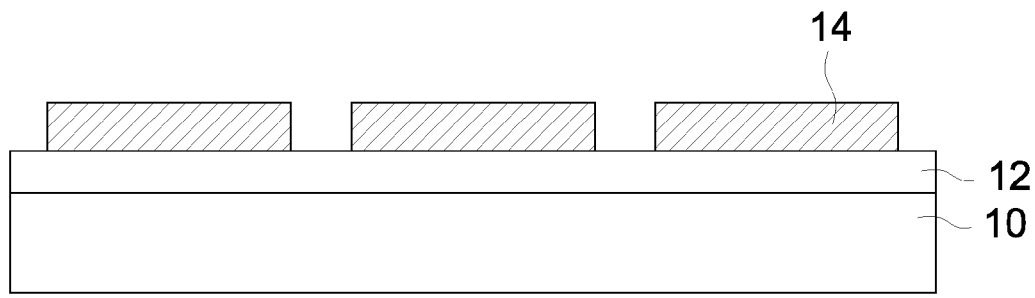
FIGS. 1A-1C illustrate flow charts of a manufacturing process of optoelectronic elements in accordance with an embodiment of the present application.
Figure 1B:
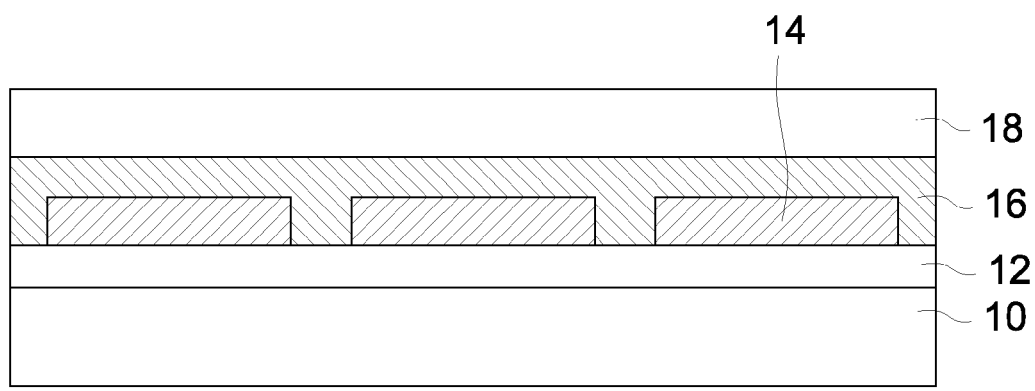
Figure 1C:
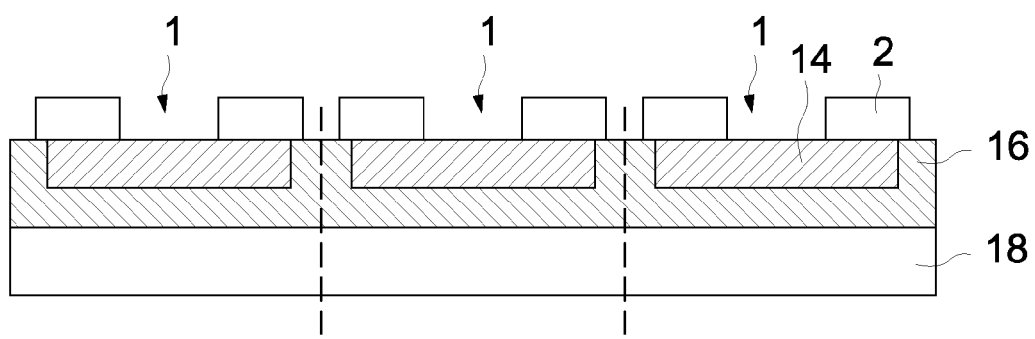

FIGS. 1A-1C disclose flow charts of a manufacturing process of optoelectronic elements 1 in accordance with an embodiment of the present application. Referring to FIG. 1A, there is a wafer including a temporary carrier 10; a bonding layer 12 formed on the temporary carrier 10; and a plurality of optoelectronic units 14 formed on the bonding layer 12. Referring to FIG. 1B, a first transparent structure 16 is formed on the bonding layer 12 and the plurality of optoelectronic units 14. The first transparent structure 16 can cover more than one surface at least one of the plurality of optoelectronic units 14. A second transparent structure 18 is formed on the first transparent structure 16. Referring to FIG. 1C, the temporary carrier 10 and the bonding layer 12 are removed, and a plurality of conductive structures 2 is formed on the surfaces of the plurality of optoelectronic units 14 and the first transparent structure 16. The wafer can be separated to form the plurality of optoelectronic elements 1.

The temporary carrier 10 and the second transparent structure 18 can support the optoelectronic unit 14 and the first transparent structure 16. The material of the temporary carrier 10 includes conductive material such as Diamond Like Carbon (DLC), graphite, carbon fiber, Metal Matrix Composite (MMC), Ceramic Matrix Composite (CMC), Polymer Matrix Composite (PMC), Ni, Cu, Al, Si, ZnSe, GaAs, SiC, GaP, GaAsP, ZnSe, InP, LiGaO$_2$, LiAlO$_2$, or the combination thereof, or insulating material such as sapphire, diamond, glass, epoxy, quartz, acryl, Al$_2$O$_3$, ZnO, AlN, or the combination thereof.

The second transparent structure 18 can be transparent to the light generated from the optoelectronic unit 14. The material of the second transparent structure 18 can be transparent material such as sapphire, diamond, glass, epoxy, quartz, acryl, SiO$_x$, Al$_2$O$_3$, ZnO, silicone, or the combination thereof. In addition, the second transparent structure 18 can also be transparent to the light, like the sunlight, from the environment in another embodiment. A thickness of the second transparent structure 18 is about 300 μm to 500 μm.

The bonding layer 12 can adhesively connect the temporary carrier 10 with the optoelectronic unit 14, and be easily removed after the second transparent structure 18 is formed on the first transparent structure 16. The material of the bonding layer 12 can be insulating material, UV tape, or thermal release tape. The insulating material includes but is not limited to benzocyclobutene (BCB), Su8, epoxy, or spin-on-glass (SOG).

The first transparent structure 16 covers the optoelectronic units 14 to fix and support the optoelectronic units 14 and enhances the mechanical strength of the optoelectronic elements 1. The first transparent structure 16 can be transparent to the light generated from the optoelectronic unit 14. The material of the first transparent structure 16 and the second transparent structure 18 can be the same or different. The coefficient of thermal expansion (CTE) of the first transparent structure 16 is about 50 ppm/° C.~400 ppm/° C. The material of the first transparent structure 16 can be transparent material such as epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, fluorocarbon polymer, glass, Al$_2$O$_3$, SINR, SOG, or the combination thereof. The refractive indices of the first transparent structure 16 and the second transparent structure 18 can be the same or different. A thickness of the first transparent structure 16 is about 200 μm to 300 μm. In addition, the first transparent structure 16 can be transparent to the light from the environment such as the sunlight as well.

The optoelectronic unit 14 provides luminous energy, electric energy, or both, such as the LED or the solar cell. A thickness of the optoelectronic unit 14 is about 100 μm. When the optoelectronic unit 14 is the LED for emitting light, the refractive index of the first transparent structure 16 is larger than that of the second transparent structure 18 to increase the probability of extracting the light out of the optoelectronic element 1. When the optoelectronic unit 14 is the solar cell for absorbing light, the refractive index of the first transparent structure 16 is smaller than that of the second transparent structure 18 to increase the probability of the light entering the optoelectronic element 1.

Figure 2A:
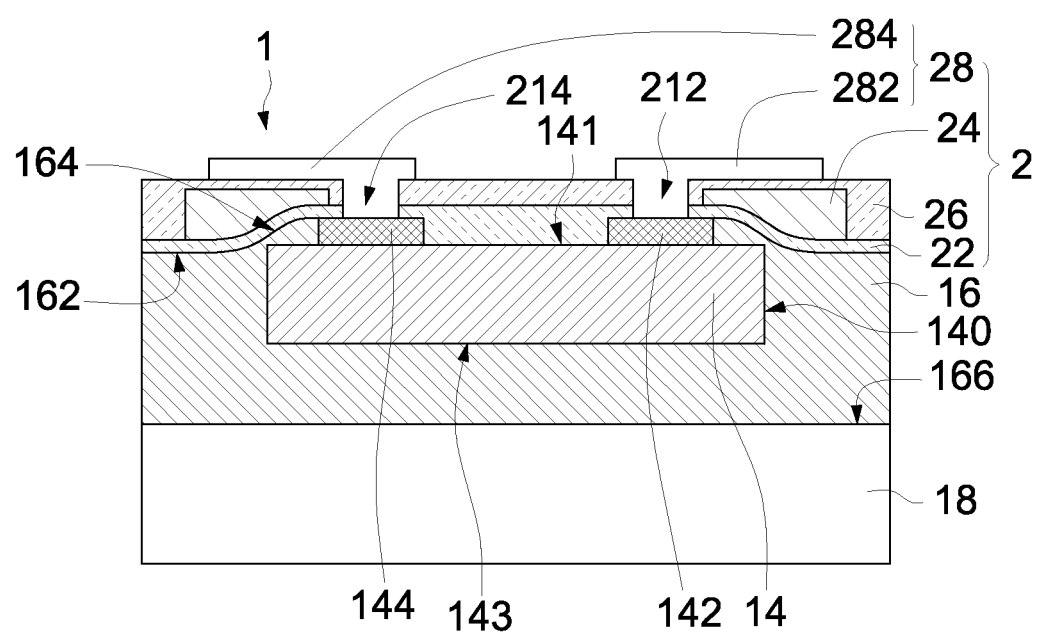
FIG. 2A illustrates a cross-sectional view of an optoelectronic element in accordance with an embodiment of the present application.

Referring to FIG. 2A which shows a cross-sectional view of an optoelectronic element 1 in accordance with an embodiment of the present application, the optoelectronic element 1 includes the second transparent structure 18; the first transparent structure 16 on the second transparent structure 18; the optoelectronic unit 14 on the first transparent structure 16; and the conductive structure 2 on the optoelectronic unit 14 and the first transparent structure 16. The optoelectronic unit 14 includes a first metal layer 142 and a second metal layer 144 formed on a first top surface 141; a first bottom surface 143 opposite to the first top surface 141 and close to the second transparent structure 18; and more than one lateral surface 140 between the first top surface 141 and the first bottom surface 143. The conductive structure 2 includes a first insulating layer 22 formed on the optoelectronic unit 14 and the first transparent structure 16 and covering portions of the first metal layer 142 and the second metal layer 144; a reflective layer 24 formed on the first insulating layer 22; a second insulating layer 26 formed on the first insulating layer 22 and the reflective layer 24 and covering the reflective layer 24; a first opening 212 and a second opening 214 formed in the first insulating layer 22 and the second insulating layer 26 to expose the first metal layer 142 and the second metal layer 144 respectively; and an electrode 28 including a first conductive layer 282 and a second conductive layer 284 which are formed on the second insulating layer 26, and in the first opening 212 and the second opening 214 to electrically connect with the first metal layer 142 and the second metal layer 144 respectively.

The first insulating layer 22 can electrically isolate the optoelectronic unit 14 from the reflective layer 24 and protect the optoelectronic unit 14 from being damaged by the element diffused from the material of the reflective layer 24. The first transparent structure 16 includes a second top surface 162 under the first insulating layer 22 and a second bottom surface 166 close to the second transparent structure 18. The second top surface 162 is substantially lower than the first top surface 141. However, the second top surface 162 includes a slope 164 adjacent to the first top surface 141. It is better that the slope 164 can be located over a region of the first top surface 141 between the first and the second metal layers 142 and 144 and the lateral surface 140. Moreover, a distance between a portion of the second top surface 162 and the second bottom surface 166 can be the same as that between the second bottom surface 166 and the first top surface 141 in another embodiment.

The first insulating layer 22 can be adhesive to the first transparent structure 16 and/or to the reflective layer 24. The transparency of the first insulating layer 22 to the light generated from the optoelectronic unit 14 and/or from the environment is higher than 85%. The CTE of the first insulating layer 22 is smaller than that of the first transparent structure 16. The CTE of the first insulating layer 22 can be between that of the first transparent structure 16 and the reflective layer 24 preferably. The CTE of the first insulating layer 22 is about 3 ppm/° C. to 200 ppm/° C., preferably 20 ppm/° C. to 70 ppm/° C. The material of the first insulating layer 22 can be the same as or different from that of the first transparent structure 16. The material of the first insulating layer 22 can be photoresist material for forming the openings so the first insulating layer 22 needs to be cured in the lithography process. The curing temperature of the first insulating layer 22 is not more than 350° C. to avoid damaging the first transparent structure 16 in high temperature. The photoresist material includes but is not limited to AL-polymer, BCB, SINR, Su8, or SOG. The first insulating layer 22 can include a rough surface with a roughness higher than that of the first top surface 141. A thickness of the first insulating layer 22 is substantially constant, for example, about 2 μm to 3 μm.

The reflective layer 24 can reflect the light generated from the optoelectronic unit 14 or from the environment. A thickness of the reflective layer 24 is substantially constant, for example, about 1 μm to 3 μm. The reflective layer 24 overlaps portions of the first metal layer 142 and the second metal layer 144. The reflective layer 24 can further include a plurality of sub-layers (not shown). The CTE of the reflective layer 24 is about 5 ppm/° C. to 25 ppm/° C. The reflective layer 24 can have a reflectivity of 70% or above to the light generated from the optoelectronic unit 14 and/or from the environment. The material of the reflective layer 24 includes but is not limited to metal material such as Cu, Al, Sn, Au, Ag, Ti, Ni, Ag—Ti, Ni—Sn, Au alloy, Ni—Ag, Ti—Al, and so on. The reflective layer 24 can include a rough surface with a roughness higher than that of the first top surface 141.

The second insulating layer 26 can electrically isolate the first conductive layer 282 and the second conductive layer 284 from the reflective layer 24, and protect the reflective layer 24 from being damaged by the first conductive layer 282 and the second conductive layer 284. The second insulating layer 26 can fix the reflective layer 24 and enhances the mechanical strength of the conductive structure 2 as well. The material of the second insulating layer 26 can be the same as and/or different from that of the first insulating layer 22. The material of the second insulating layer 26 includes but is not limited to photoresist material such as AL-polymer, BCB, SINR, Su8, SOG, PI, or DLC. The second insulating layer 26 can include a rough surface with a roughness higher than that of the first top surface 141. A thickness of the second insulating layer 26 is substantially constant, for example, about 4 μm to 5 μm.

The electrode 28 can be integrally formed by evaporation or electroplating. The ratio of the top surface area of the electrode 28 to that of the second transparent structure 18 is not smaller than 50%. The first conductive and second conductive layers 282 and 284 are for receiving external voltage. The material of the first conductive and second conductive layers 282 and 284 can be metal material. The metal material includes but is not limited to Cu, Sn, Au, Ni, Ti, Pb, Cu—Sn, Cu—Zn, Cu—Cd, Sn—Pb—Sb, Sn—Pb—Zn, Ni—Sn, Ni—Co, Au alloy, Au—Cu—Ni—Au, the combination thereof, and so on. The first conductive layer 282 and/or the second conductive layer 284 can include a plurality of sub-layers (not shown). The first conductive layer 282 and/or the second conductive layer 284 can have a reflectivity of 70% or above to the light generated from the optoelectronic unit 14 and/or from the environment. A thickness of the first conductive layer 282 is a substantially constant, for example, about 12 μm. A thickness of the second conductive layer 284 is substantially constant, for example, about 12 μm. The ratio of the top surface area of the first conductive layer 282 and the second conductive layer 284 to the area of the second bottom surface 166 is more than 50%.

Figure 2B:
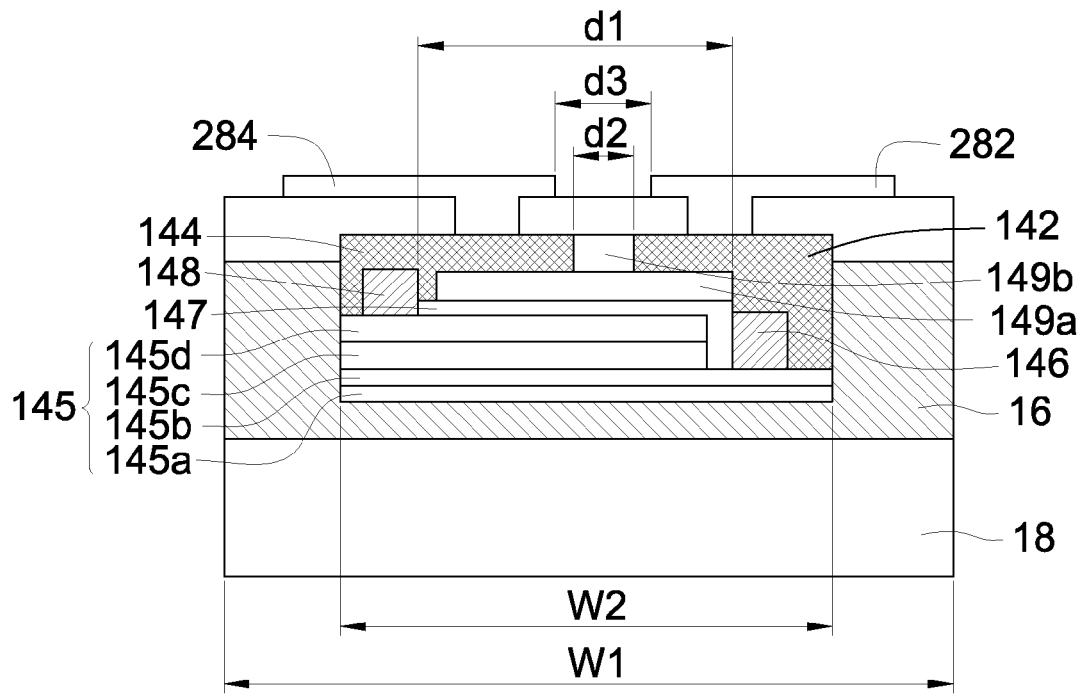
FIG. 2B illustrates a cross-sectional view of the optoelectronic unit shown in FIG. 2A.

The optoelectronic unit 14 can be an LED including a light emitting structure 145, a first dielectric layer 149a, a passivation layer 147, a first bonding pad 146, a second bonding pad 148, the first metal layer 142, the second metal layer 144, and a second dielectric layer 149b, as FIG. 2B shows. The light emitting structure 145 includes a substrate 145a, a first conductive type layer 145b, an active layer 145c, and a second conductive type layer 145d. The active layer 145c is disposed on the first conductive type layer 145b and is a light emitting layer. The second conductive type layer 145d is disposed on the active layer 145c. The first bonding pad 146 is disposed on the light emitting structure 145 and is electrically connected to the first conductive layer 145b. The second bonding pad 148 is disposed on the light emitting structure 145 and is electrically connected to the second conductive type layer 145d. The passivation layer 147 is disposed on the light emitting structure 145 and isolates the first bonding pad 146 from the active layer 145c and the second conductive type layer 145d. The first dielectric layer 149a is disposed on the light emitting structure 145. The first metal layer 142 is disposed on the light emitting structure 145 and is electrically connected to the first conductive type layer 145b. A portion of the first metal layer 142 is disposed on the first dielectric layer 149a. The second metal layer 144 is disposed on the light emitting structure 145 and is electrically connected to the second conductive type layer 145d. A portion of the second metal layer 144 is disposed on the first dielectric layer 149a. The second dielectric layer 149b is disposed on the first dielectric layer 149a. The first dielectric layer 149a and the second dielectric layer 149b electrically isolate the first metal layer 142 from the second metal layer 144. A portion of the first dielectric layer 149a is a transparent layer, and a surface of the first dielectric layer 149a contacting the first metal layer 142 and/or the second metal layer 144 is for reflecting the light generated from the light emitting structure 145. The first dielectric layer 149a can include a reflective structure in another embodiment. The reflective structure includes distributed bragg reflector (DBR) and/or a reflective film. The reflective film can includes metal material such as Cu, Al, Sn, Au, Ag, Ti, Ni, Ag—Ti, Ni—Sn, Au alloy, Ni—Ag, Ti—Al, and so on.

There are a first distance d1 between the first bonding pad 146 and the second bonding pad 148, a second distance d2 between the first metal layer 142 and the second metal layer 144, and a third distance d3 between the first conductive layer 282 and the second conductive layer 284, as FIG. 2B shows. The first distance d1 is larger than the second distance d2 and the third distance d3. The second distance d2 and the third distance d3 can be the same or difference. The second distance d2 is larger than the third distance d3 in an embodiment. The second distance d2 can also be smaller than the third distance d3 in another embodiment. The third distance d3 is about 100 μm to 300 μm. The second transparent structure 18 contains a first width w1 and the optoelectronic unit 14 contains a second width w2. The ratio of the first width w1 to the second width w2 is about 1.5 to 3, preferably 2 to 2.5.

Figure 2C:
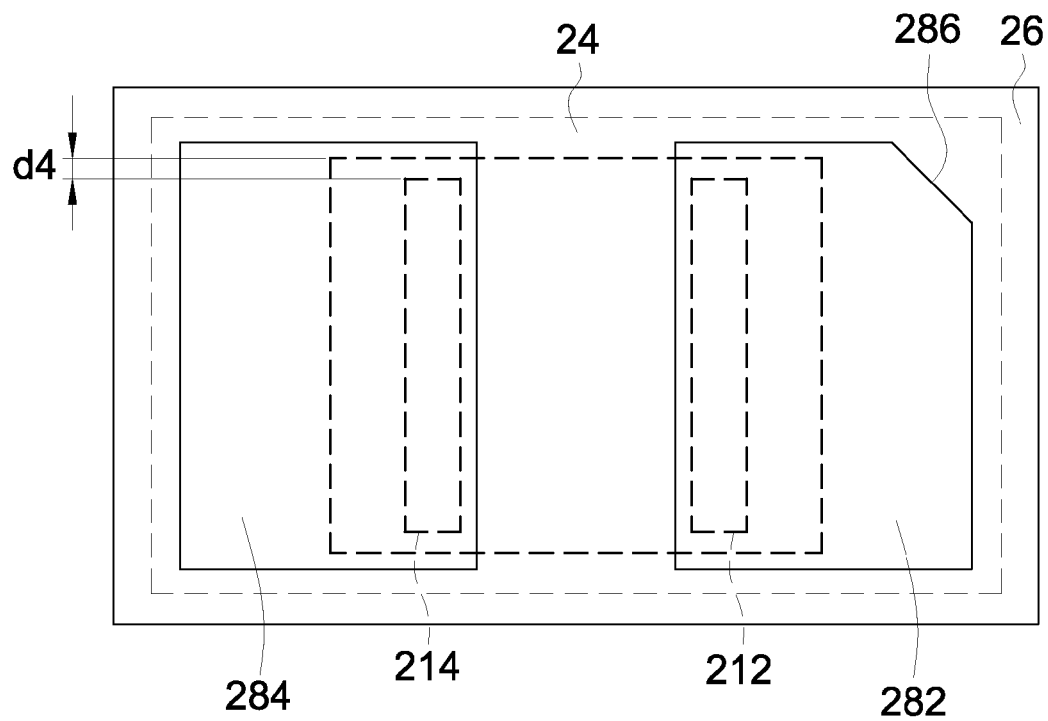
FIG. 2C illustrates a top view of the optoelectronic element shown in FIG. 2A.

Referring to FIG. 2C which shows a top view of the optoelectronic element 1 shown in FIG. 2A, the first conductive layer 282 contains a truncated corner 286 at a side far from the second conductive layer 284. There is a fourth distance d4 between the first opening 212 and the reflective layer 24 that is about 25 μm to 75 μm.

The optoelectronic element 1 can be bonded to a submount through an adhesive material in another embodiment. The adhesive material can be metal material, transparent material, or an anisotropic conductive film. The metal material includes but is not limited to Cu, Sn, Au, Ni, Ti, Pb, Cu—Sn, Cu—Zn, Cu—Cd, Sn—Pb—Sb, Sn—Pb—Zn, Ni—Sn, Ni—Co, Au alloy, Au—Cu—Ni—Au, or the combination thereof. The transparent material includes but is not limited to BCB, Sub, epoxy, or SOG.

Figure 3A:
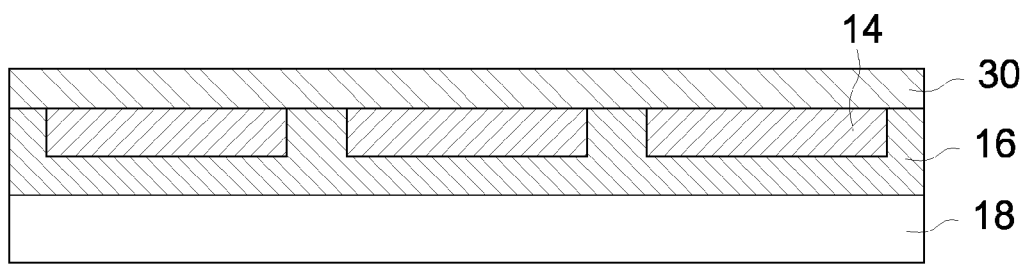
FIGS. 3A-3F illustrate flow charts of a manufacturing process of electroplating an electrode on optoelectronic elements in accordance with an embodiment of the present application.
Figure 3B:
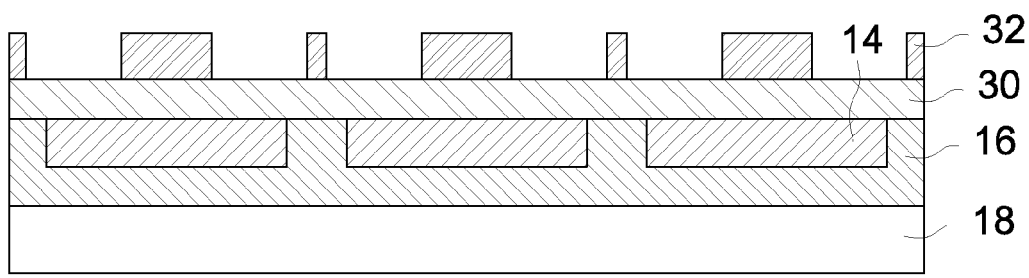
Figure 3C:
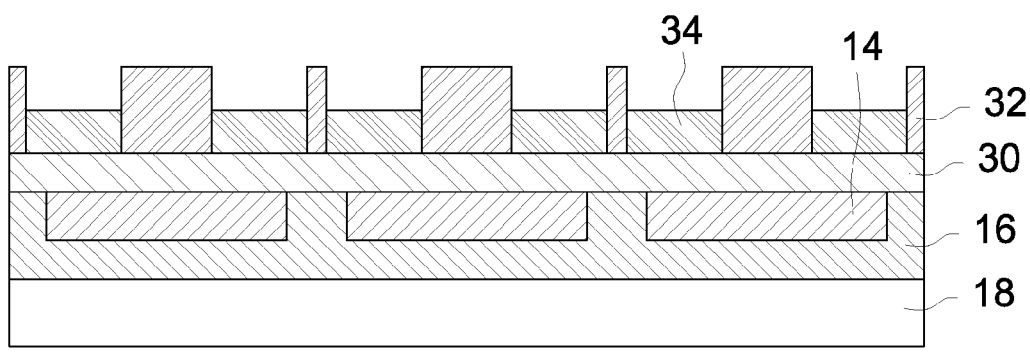
Figure 3D:
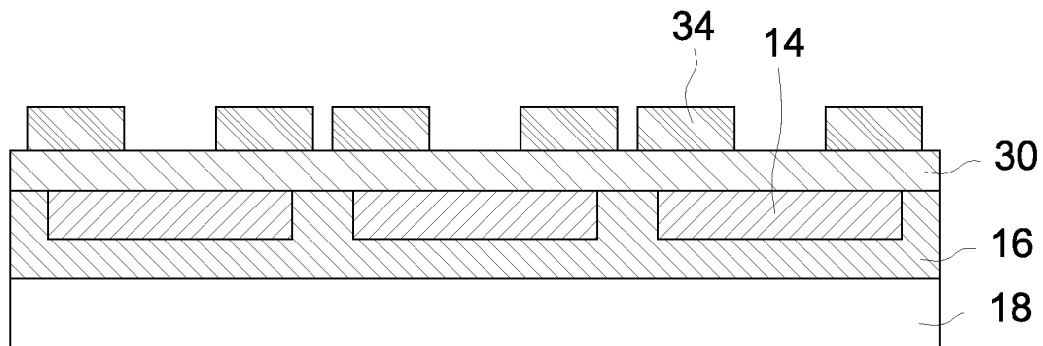
Figure 3E:
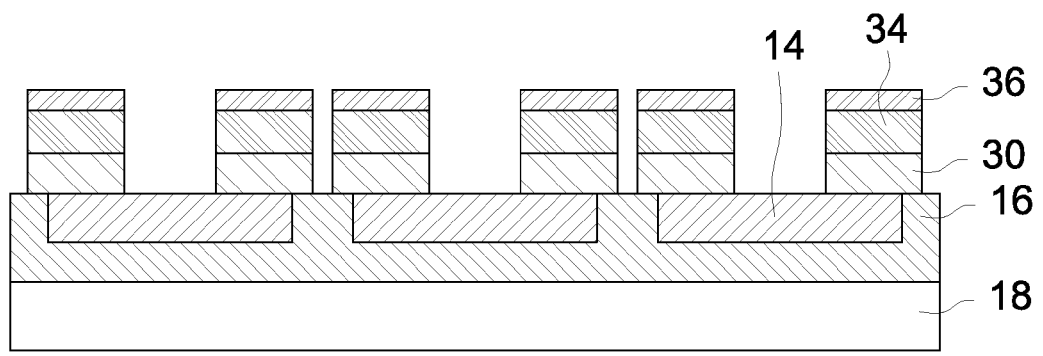
Figure 3F:
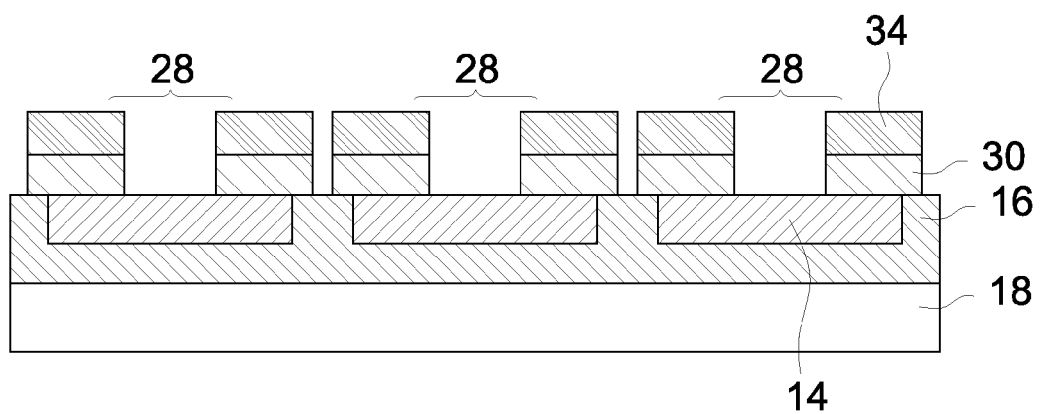

FIGS. 3A-3F disclose flow charts of a manufacturing process of electroplating the electrode 28 on the optoelectronic unit 14. Referring to FIG. 3A, a seed layer 30 is formed on the optoelectronic units 14 and the first transparent structure 16. A first photoresist 32 is formed on the seed layer 30 to expose portions of the seed layer 30, as FIG. 3B shows. An electroplating layer 34 is electroplated on the portions of the seed layer 30 where the first photoresist 32 does not cover, as FIG. 3C shows. Referring to FIG. 3D, the first photoresist 32 is removed to expose other portions of the seed layer 30. A second photoresist 36 is formed on the electroplating layer 34. Then, the exposed portions of the seed layer 30 are removed, as FIG. 3E shows. The second photoresist 36 is removed to expose the electroplating layer 34 for forming the electrode 28, referring to FIG. 3F.

Figure 4:
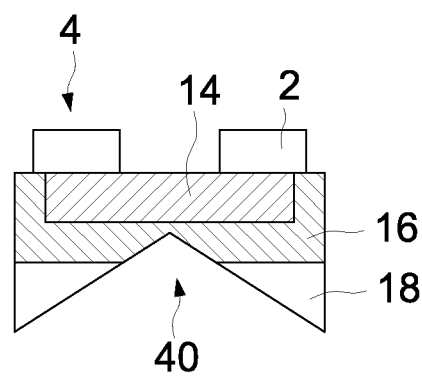
FIG. 4 illustrates a cross-sectional view of an optoelectronic element in accordance with another embodiment of the present application.

Referring to FIG. 4 which shows a cross-sectional view of an optoelectronic element 4 in accordance with another embodiment of the present application, the optoelectronic element 4 is similar to the optoelectronic element 1 and further includes a recess 40 formed in the second transparent structure 18 such that the second transparent structure 18, as an optical element, can process the light generated from the optoelectronic unit 14 or from the environment. The recess 40 can be further formed in the first transparent structure 16. The shape of the recess 40 can be triangle in the cross-sectional view in this embodiment.

Figure 5:
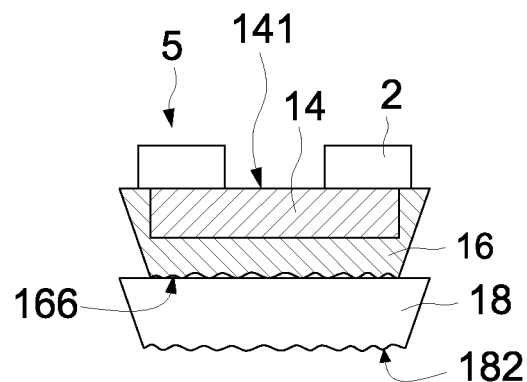
FIG. 5 illustrates a cross-sectional view of an optoelectronic element in accordance with another embodiment of the present application.

Referring to FIG. 5, the second transparent structure 18 of an optoelectronic element 5 can be trapezoid in another embodiment. The second transparent structure 18 further includes a third bottom surface 182. The third bottom surface 182 can be a rough surface with a roughness higher than that of the first top surface 141, or a flat surface. The shape of the second transparent structure 18 includes but is not limited to triangle, semicircle, quarter circle, trapezoid, pentagon, or rectangle in the cross-sectional view. The first transparent structure 16 can also include the same or different shape of the second transparent structure 18. The second bottom surface 166 can also be a rough surface with a roughness higher than that of the first top surface 141, or a flat surface in another embodiment.

Figure 6:
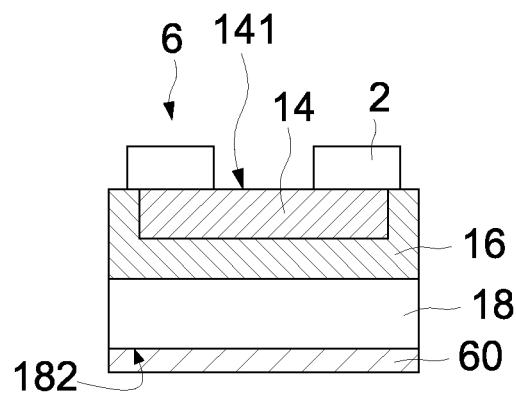
FIG. 6 illustrates a cross-sectional view of an optoelectronic element in accordance with another embodiment of the present application.
Figure 7:
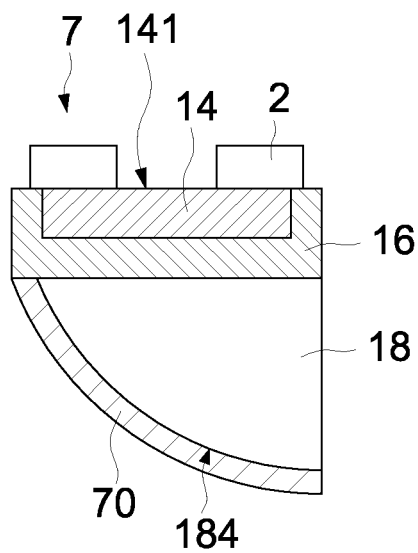
FIG. 7 illustrates a cross-sectional view of an optoelectronic element in accordance with another embodiment of the present application.
Figure 8:
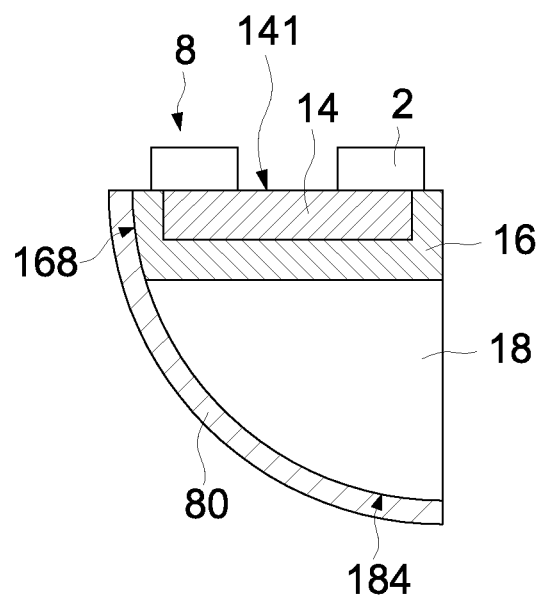
FIG. 8 illustrates a cross-sectional view of an optoelectronic element in accordance with another embodiment of the present application.

An optoelectronic element 6 is similar to the optoelectronic element 5 and further includes a mirror 60 formed under the third bottom surface 182, as FIG. 6 shows. The mirror 60 can reflect the light generated from the optoelectronic unit 14 or from the environment. Referring to FIG. 7, an optoelectronic element 7 includes the optoelectronic unit 14, the conductive structure 2, the first transparent structure 16, and the second transparent structure 18. The second transparent structure 18 contains a first side 184 which is not parallel to the first top surface 141 and a mirror 70 is formed under the first side 184 to reflect light generated from the optoelectronic unit 14 or from the environment, in another embodiment. The first side 184 can be parabolic curve, arc, or bevel to the first top surface 141 in the cross-sectional view, for example. In another embodiment, an optoelectronic element 8 is similar to the optoelectronic element 7 and the first transparent structure 16 further includes a second side 168 which is not parallel to the first top surface 141, as FIG. 8 shows. A mirror 80 is formed under the first side 184 and the second side 168 to reflect light generated from the optoelectronic unit 14 or from the environment.

Figure 9A:
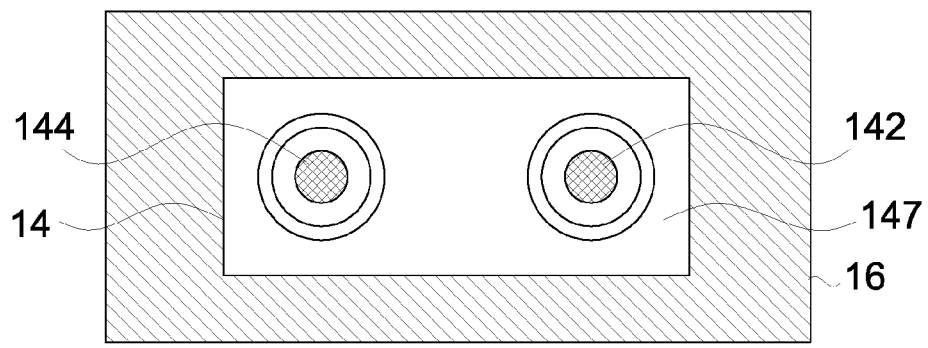
FIGS. 9A-9C illustrate flow charts of a manufacturing process of an optoelectronic element in accordance with another embodiment of the present application.
Figure 9B:
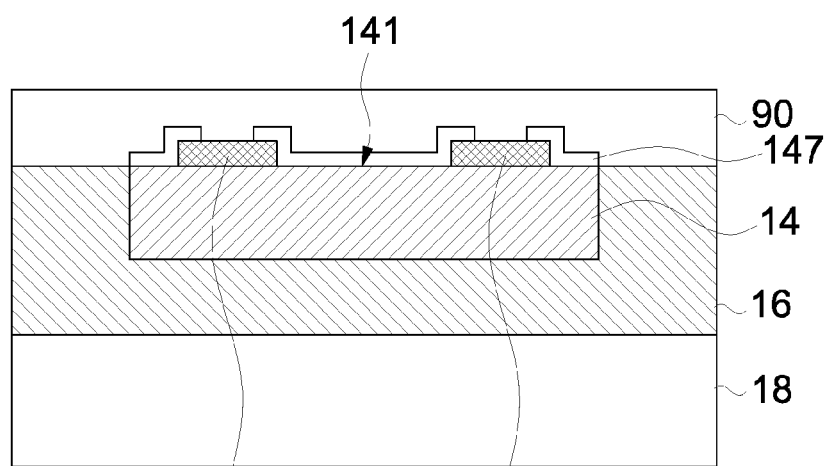
Figure 9C:
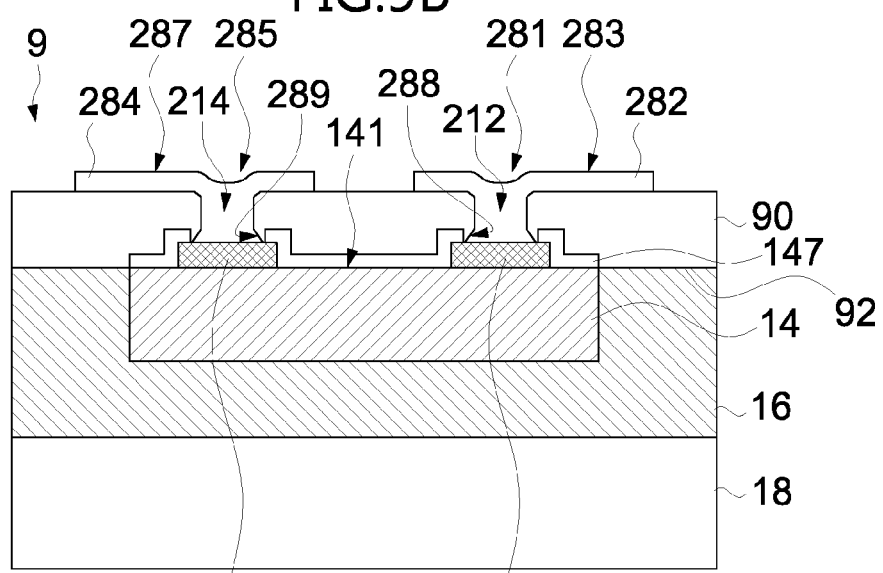

FIGS. 9A-9C disclose flow charts of a manufacturing process of an optoelectronic element 9 in accordance with another embodiment of the present application. Referring to FIGS. 9A-9B, the optoelectronic unit 14 and the first transparent structure 16 are located on the second transparent structure 18. The passivation layer 147 is formed on the first top surface 141 and exposes the first metal layer 142 and the second metal layer 144, wherein the passivation layer 147 can cover portions of the first metal layer 142 and the second metal layer 144. In another embodiment, the passivation layer 147 can expose all the first metal layer 142 and the second metal layer 144. Further, the passivation layer 147 can expose a portion of the first top surface 141. An optical layer 90 is formed on the optoelectronic unit 14 and the first transparent structure 16. The optical layer 90 covers at least portions of the optoelectronic unit 14 and the first transparent structure 16 and surrounds the first metal layer 142 and the second metal layer 144. Referring to FIG. 9C, a portion of the optical layer 90 is removed to form the first opening 212 and the second opening 214 that expose the first metal layer 142 and the second metal layer 144. The first conductive layer 282 and the second conductive layer 284 are formed on the optical layer 90 and in the first opening 212 and the second opening 214, wherein the first conductive layer 282 and the second conductive layer 284 are electrically connected with the first metal layer 142 and the second metal layer 144 respectively to form the optoelectronic element 9. The optical layer 90 can electrically insulate the first conductive layer 282 from the second conductive layer 284. The reflectivity of the optical layer 90 is at least 50% to the light generated from the optoelectronic unit 14. The optical layer 90 can be a single-layer structure. Optionally, the optical layer 90 includes a diffusing surface 92 far from the first conductive layer 282. The diffusing surface 92 includes a plurality of particles diffusing the light generated from the optoelectronic unit 14. The diffusion is a phenomenon that light emitted to a rough surface of an object can be reflected disorderly. In another embodiment, the optical layer 90 can include a plurality of insulating layers stacked to form a Distributed Bragg Reflector (DBR). The thickness of the optical layer 90 is about 4 μm to 20 μm, preferably 5 μm to 10 μm. The material of the optical layer 90 can be epoxy, $SiO_x$, $Al_2O_3$, $TiO_2$, silicone, resin, or the combination thereof. The material of the particles can be $Al_2O_3$, $TiO_2$, silicone, or the combination thereof. A method of forming the optical layer 90 includes spin coating, screen printing, or stencil printing. A method of removing the optical layer 90 includes etching. The optical layer 90 can provide functions of diffusion, reflection, and insulation so the amount and cost of diffusing material, reflective material, and insulating material can be reduced, and the damage caused by the difference of the material characteristic, such as coefficient of thermal expansion or mechanical strength, can be avoided. Therefore, the yield can be enhanced. Furthermore, the optical layer 90 can prevent the moisture from entering the optoelectronic unit 14 so the reliability is improved. The first conductive layer 282 includes a first plug region 281 above the first metal layer 142 and a first extended region 283 overlapping a portion of the optical layer 90, wherein the distance between the first plug region 281 and the first top surface 141 might be smaller than that between the first extended region 283 and the first top surface 141. The distance between the first plug region 281 and the first top surface 141 is smaller than that between the top surface of the optical layer 90 and the first top surface 141 in another embodiment. The top surface of the second conductive layer 284 includes a second plug region 285 above the second metal layer 144 and a second extended region 287 overlapping a portion of the optical layer 90, wherein the distance between the second plug region 285 and the first top surface 141 is smaller than that between the second extended region 287 and the first top surface 141. The distance between the second plug region 285 and the first top surface 141 is smaller than that between the top surface of the optical layer 90 and the first top surface 141 in another embodiment. Furthermore, there might be recesses 288/289 formed between the optical layer 90 and the first metal layer 142/the second metal layer 144 so the first conductive layer 282 and the second conductive layer 284 can further fill into the recesses 288/289 to enhance the adhesion between the first conductive layer 282/the second conductive layer 284 and the optical layer 90. The recesses are formed when a portion of the optical layer 90 is removed to expose the first metal layer 142 and the second metal layer 144. The method of removing the optical layer 90 can be wet etching.

Figure 10A:
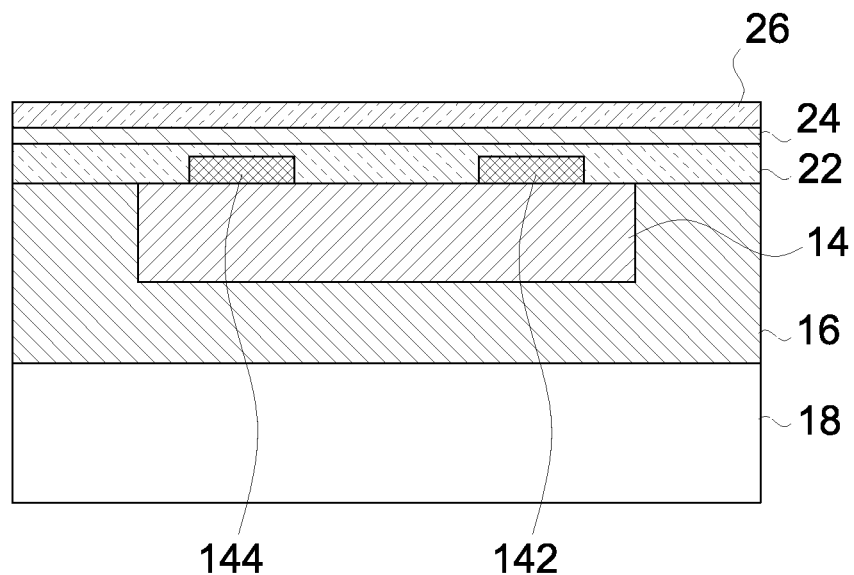
FIGS. 10A-10B illustrate flow charts of a manufacturing process of an optoelectronic element in accordance with another embodiment of the present application.
Figure 10B:
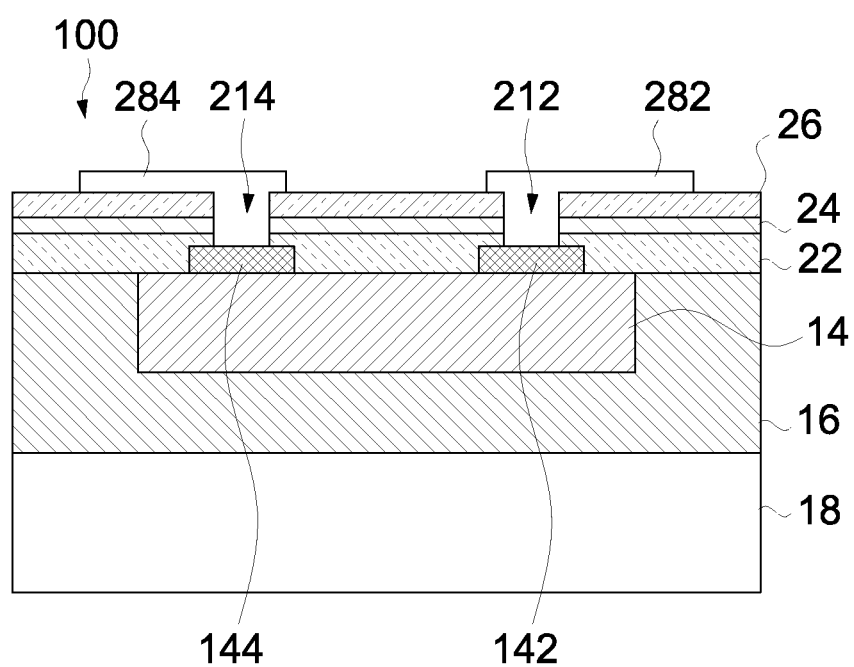

FIGS. 10A-10B disclose flow charts of a manufacturing process of an optoelectronic element 100 in accordance with another embodiment of the present application. Referring to FIG. 10A, the optoelectronic unit 14 and the first transparent structure 16 are located on the second transparent structure 18. The first insulating layer 22 is formed on the optoelectronic unit 14 and the first transparent structure 16, covers at least portions of the optoelectronic unit 14 and the first transparent structure 16, and surrounds the first metal layer 142 and the second metal layer 144. The reflective layer 24 is formed on the first insulating layer 22 and the second insulating layer 26 is formed on the reflective layer 24. Referring to FIG. 10B, portions of the first insulating layer 22, the second insulating layer 26, and the reflective layer 24 are removed to form the first opening 212 and the second opening 214 and expose the first metal layer 142 and the second metal layer 144. The first conductive layer 282 and the second conductive layer 284 are formed on the second insulating layer 26 and in the first opening 212 and the second opening 214, wherein the first conductive layer 282 and the second conductive layer 284 are electrically connected with the first metal layer 142 and the second metal layer 144 respectively to form the optoelectronic element 100. A portion of the reflective layer 24 between the first insulating layer 22 and the second insulating layer 26 is between the first metal layer 142 and the second metal layer 144. The probability of reflecting the light generated from the optoelectronic unit 14 is therefore enhanced to increase light-emitting efficiency. Furthermore, the moisture can be prevented from entering the optoelectronic unit 14 so the reliability is enhanced. The reflective layer 24 can be electrically connected with the electrode 28 and/or the first metal layer 142 and the second metal layer 144.

Figure 11:
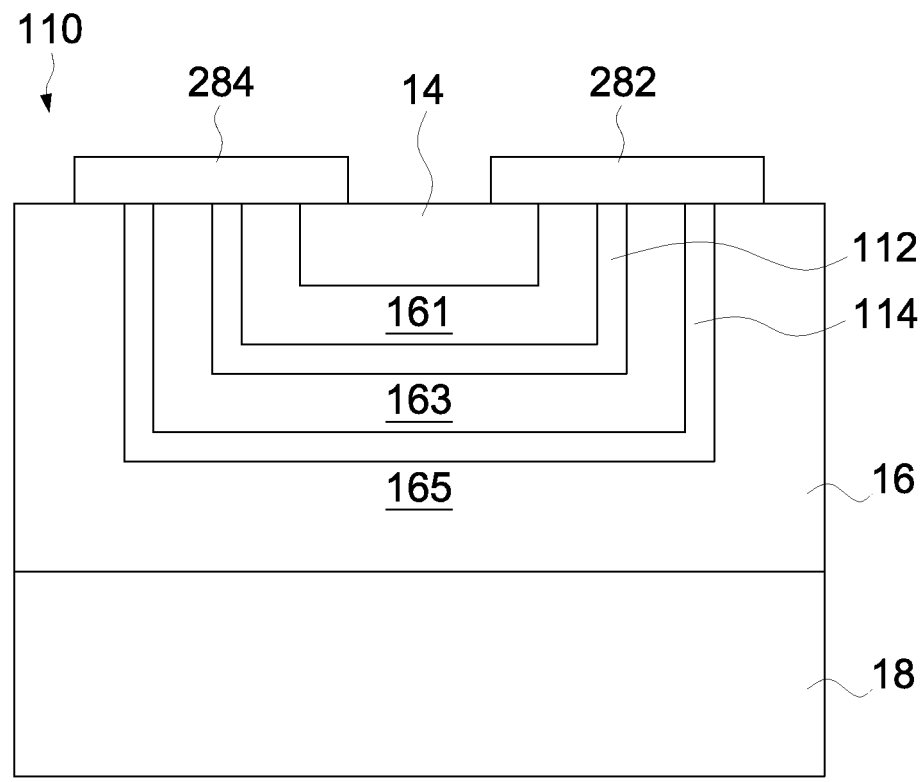
FIG. 11 illustrates a cross-sectional view of an optoelectronic element in accordance with another embodiment of the present application.

FIG. 11 illustrates a cross-sectional view of an optoelectronic element 110 in accordance with another embodiment of the present application. The optoelectronic element 110 includes the first conductive layer 282, the second conductive layer 284, the optoelectronic unit 14, and the first transparent structure 16 on the second transparent structure 18. The first transparent structure 16 includes a first transparent layer 161 covering the optoelectronic unit 14; a second transparent layer 163 covering the first transparent layer 161; a third transparent layer 165 covering the second transparent layer 163; a first wavelength-converting layer 112 located between the first transparent layer 161 and the second transparent layer 163; and a second wavelength-converting layer 114 located between the second transparent layer 163 and the third transparent layer 165. The first wavelength-converting layer 112 can be excited by the light generated from the optoelectronic unit 14 and emit light having a first wavelength. The second wavelength-converting layer 114 can be excited by the light generated from the optoelectronic unit 14 and emit light having a second wavelength. The light generated from the optoelectronic unit 14 has a third wavelength. The third wavelength is smaller than the first wavelength and the second wavelength, and the first wavelength is larger than the second wavelength. The bandgap of the first wavelength is smaller than the bandgap of the wavelength which can be absorbed by the second wavelength-converting layer 114 so the absorption of the light having the first wavelength by the second wavelength-converting layer 114 and the loss of conversion of the light having the first wavelength can be reduced. The light-emitting efficiency of the optoelectronic element 110 is therefore increased. The first wavelength-converting layer 112 and/or the second wavelength-converting layer 114 can absorb the light generated from the optoelectronic unit 14 and emit the excited light, and diffuse the light generated from the optoelectronic unit 14 and the excited light generated from the first wavelength-converting layer 112 and/or the second wavelength-converting layer 114. The structure of the first wavelength-converting layer 112 and/or the second wavelength-converting layer 114 can include quantum dot. The material of the first wavelength-converting layer 112 and/or the second wavelength-converting layer 114 includes a semiconductor material or phosphor. The phosphor includes yttrium aluminum garnet (YAG), silicate garnet, vanadate garnet, alkaline earth metal silicate, alkaline earth metal sulfides, alkaline earth metal selenides, alkaline earth metal thiogallates, metal nitrides, metal oxonitrides, mixed molybdate-tungstate, mixed oxides, mixed glass phosphors, or the combination thereof. The semiconductor material contains more than one element selected from a group consisting of Ga, Al, In, As, P, N, Zn, Cd, and Se.

Figure 12:
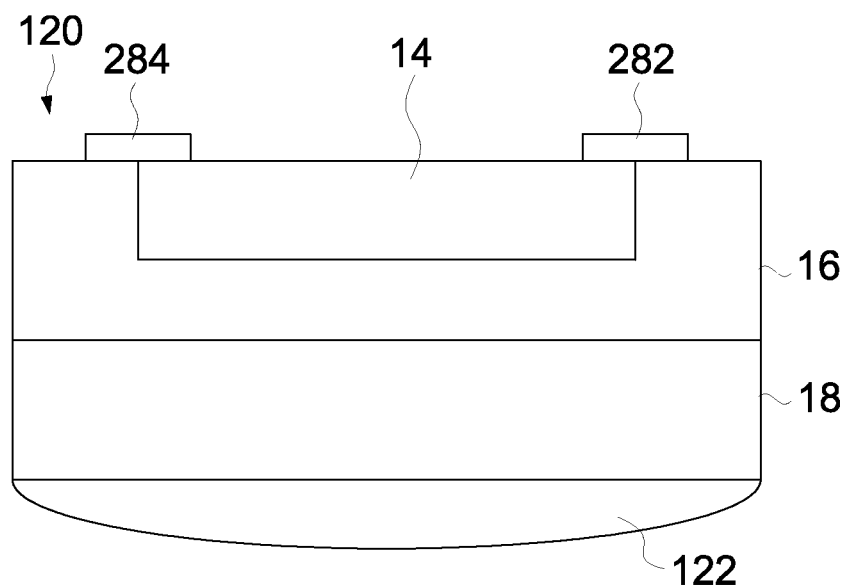
FIG. 12 illustrates a cross-sectional view of an optoelectronic element in accordance with another embodiment of the present application.

FIG. 12 illustrates a cross-sectional view of an optoelectronic element 120 in accordance with another embodiment of the present application. The optoelectronic element 120 includes the first conductive layer 282, the second conductive layer 284, the optoelectronic unit 14, the first transparent structure 16 on the second transparent structure 18, and a window layer 122 on a side of the second transparent structure 18 opposite to the first transparent structure 16. The refraction index of the window layer 122 is between that of the second transparent structure 18 and the environment for reducing the probability of the total internal reflection at the interface of the second transparent structure 18 and the environment. The refraction index of the window layer 122 is about larger than 1 and/or smaller than 2, preferably between 1.1 and 1.4. The material of the window layer 122 can be formed on the second transparent structure 18 and proceeds with the reflow process to form the window layer 122. The window layer 122 can perform as lens to process the light from the optoelectronic unit 14. The shape of the window layer 122 includes but is not limited to triangle, semicircle, quarter circle, trapezoid, pentagon, or rectangle in the cross-sectional view. The material of the window layer 122 can be epoxy, spin-on-glass (SOG), $SiO_x$, silicone, polymethyl methacrylate (PMMA), or the combination thereof.

Figure 16A:
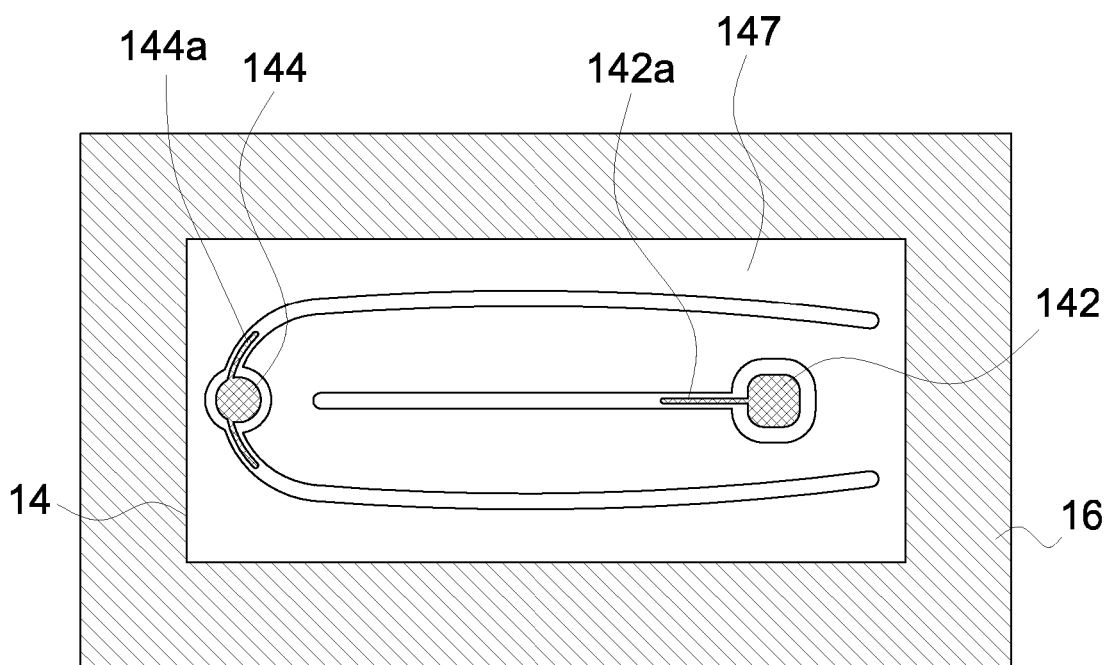
FIGS. 16A-16C illustrate flow charts of a manufacturing process of an optoelectronic element in accordance with another embodiment of the present application.
Figure 16B:
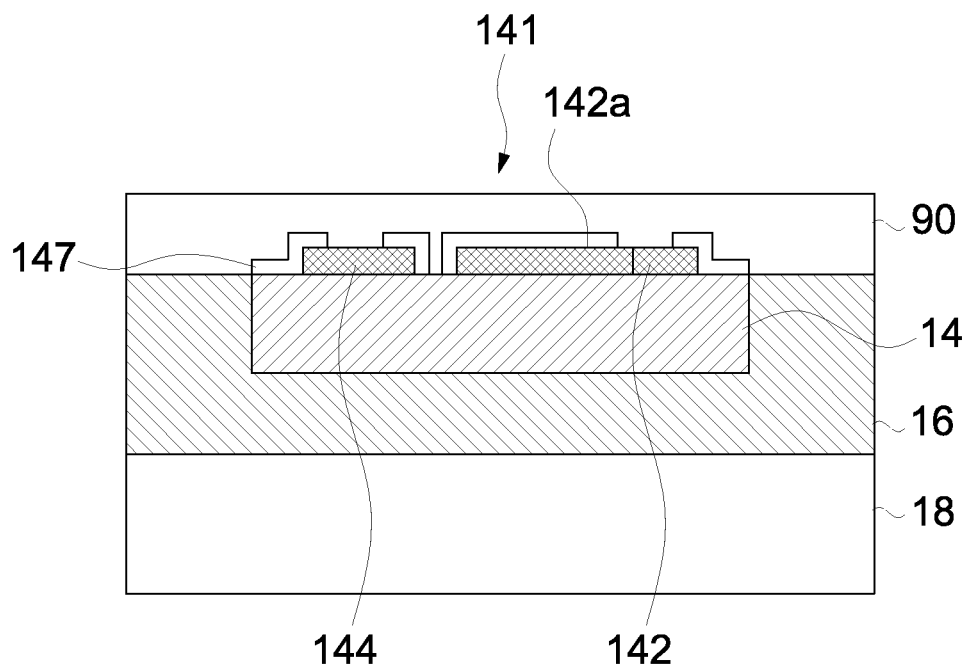
Figure 16C:
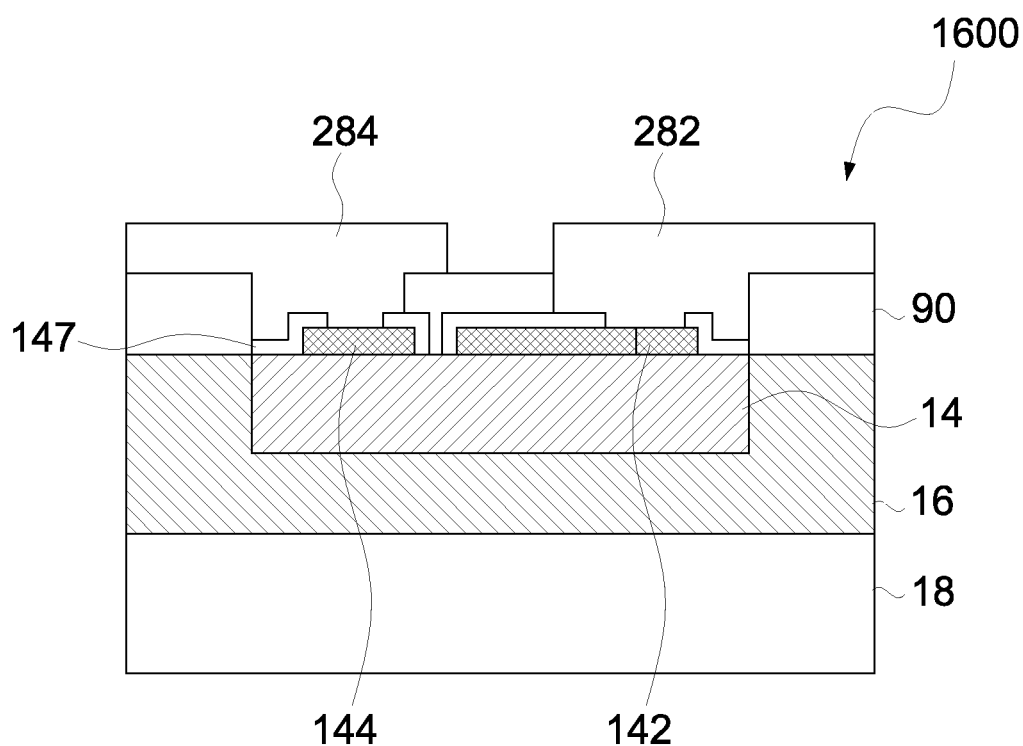

FIGS. 16A-16C disclose flow charts of a manufacturing process of an optoelectronic element 1600 in accordance with another embodiment of the present application. FIG. 16A is a top view and FIGS. 16B and 16C are cross-sectional views of the optoelectronic element 1600. Referring to FIG. 16A, the first metal layer 142 includes a first extension part 142a and/or the second metal layer 144 includes a second extension part 144a. A portion of the passivation layer 147 of the optoelectronic unit 14 is removed to expose the first metal layer 142 and the first extension part 142a and/or the second metal layer 144 and the second extension part 144a. The optical layer 90 is formed on the optoelectronic unit 14 and a first transparent structure 16 as shown in FIG. 16B. A portion of the optical layer 90 is removed to expose the first metal layer 142 and the first extension part 142a and/or the second metal layer 144 and the second extension part 144a. The first conductive layer 282 and the second conductive layer 284 are formed on the optical layer 90 and the optoelectronic unit 14 to form the optoelectronic element 1600, wherein the first conductive layer 282 and the second conductive layer 284 are electrically connected with the first metal layer 142 and the second metal layer 144 respectively, as shown in FIG. 16C. The first metal layer 142 and the second metal layer 144 of the optoelectronic element 1600 include the first extension part 142a and the second extension part 144a to enhance the current spreading and the light-emitting efficiency of the optoelectronic unit 14 is improved. The first conductive layer 282 contacts the first extension part 142a and/or the second conductive layer 284 contacts the second extension part 144a to increase the contact area between the first conductive layer 282 and the first metal layer 142 and/or between the second conductive layer 284 and the second metal layer 144. The path of heat dissipation and current conduction is increased and the efficiency of heat dissipation is therefore improved.

Figure 17A:
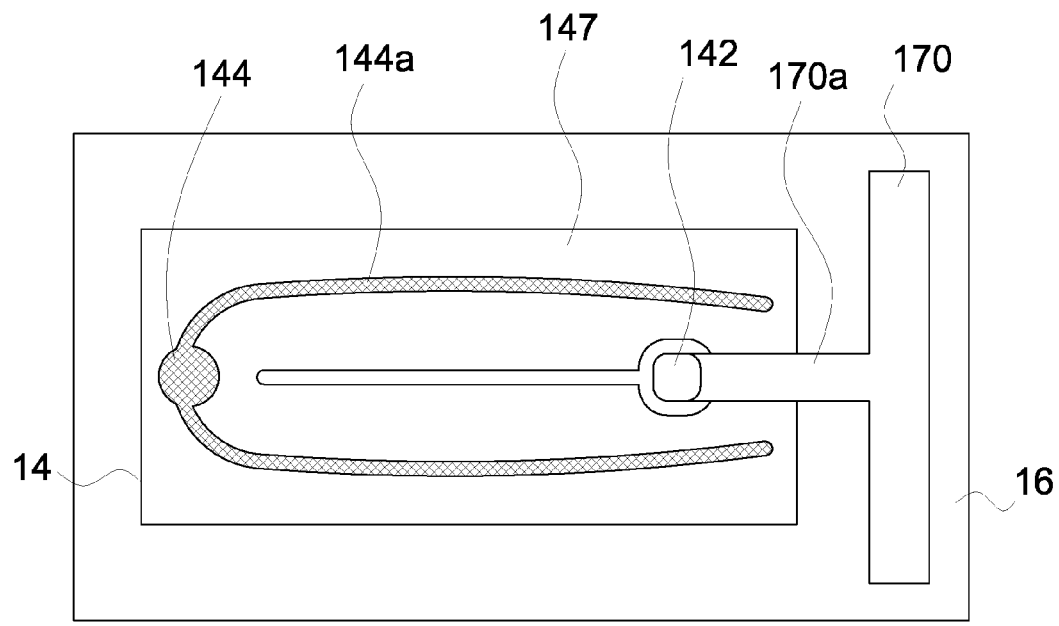
FIGS. 17A-17D illustrate flow charts of a manufacturing process of an optoelectronic element in accordance with another embodiment of the present application.
Figure 17B:
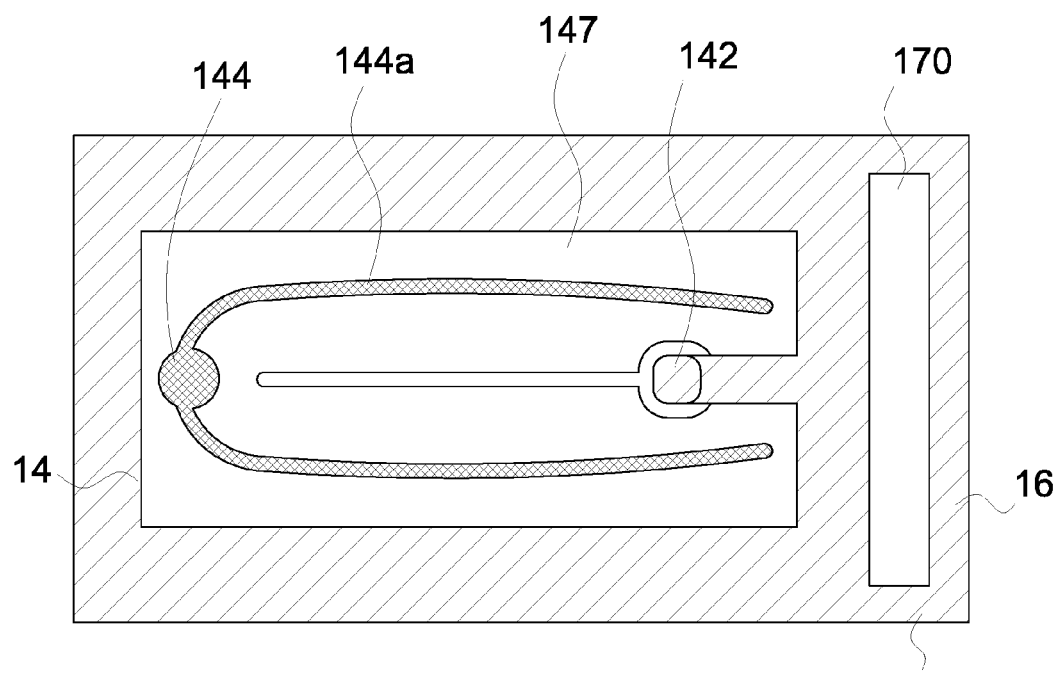
Figure 17C:
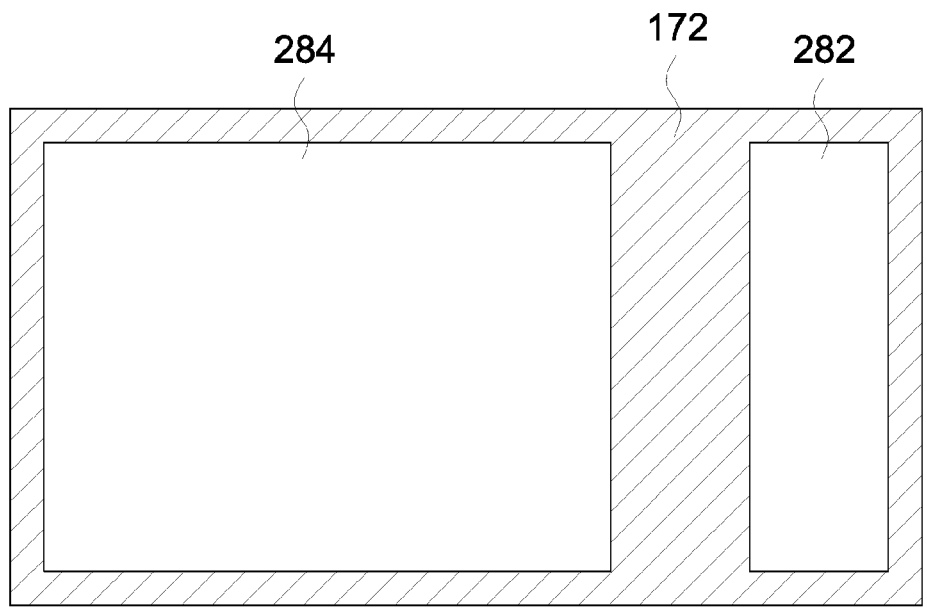
Figure 17D:
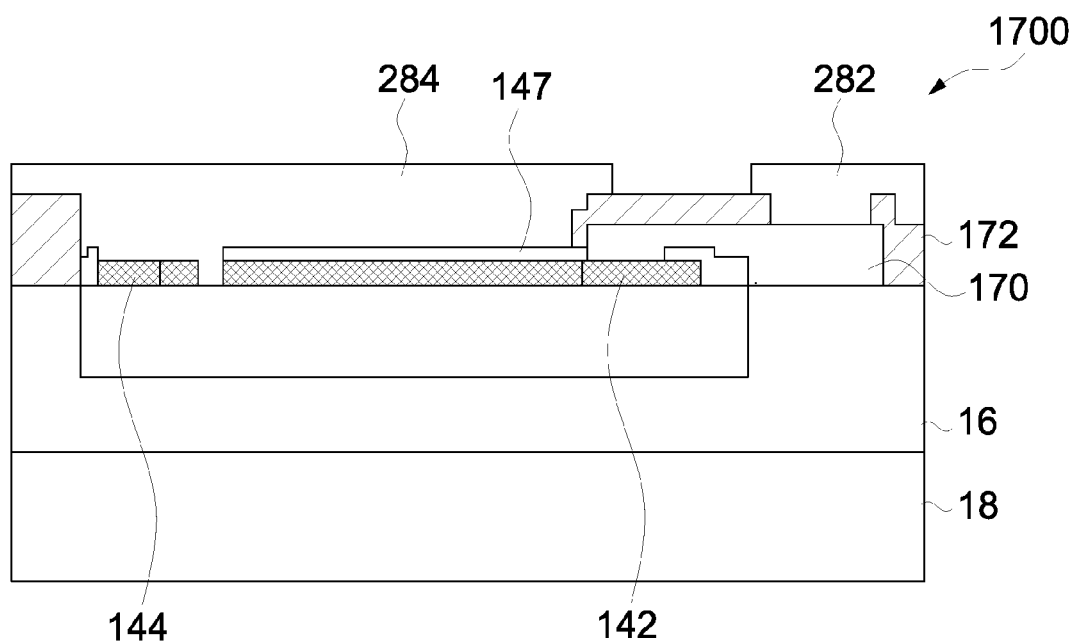

FIGS. 17A-17D disclose flow charts of a manufacturing process of an optoelectronic element 1700 in accordance with another embodiment of the present application. FIGS. 17A, 17B, and 17C are top views and FIG. 17D is a cross-sectional view of the optoelectronic element 1700. Referring to FIG. 17A, a portion of the passivation layer 147 of the optoelectronic unit 14 is removed to expose the first metal layer 142, the second metal layer 144, and the second extension part 144a. A first contact layer 170 is formed on the first transparent structure 16 and includes a connective part 170a extending toward the optoelectronic unit 14 and electrically connected with the first metal layer 142. The connective part 170a directly contacts with the first metal layer 142. An optical layer 172 is formed on the first contact layer 170 and a first transparent structure 16 and exposes a portion of the first contact layer 170, as shown in FIG. 17B. As shown in FIGS. 17C and 17D, the first conductive layer 282 is formed on the optical layer 172 and the first contact layer 170. The second conductive layer 284 is formed on the optical layer 172, the second metal layer 144, and the second extension part 144a, and is electrically connected with the second metal layer 144 and the second extension part 144a to form the optoelectronic element 1700, wherein the second conductive layer 284 is electrically insulated from the first contact layer 170. The second metal layer 144 of the optoelectronic unit 14 includes the second extension part 144a to enhance the current spreading and the light-emitting efficiency of the optoelectronic unit 14 is improved. The second conductive layer 284 contacts with the second extension part 144a to increase the contact area between the second conductive layer 284 and the second metal layer 144. The path of heat dissipation and current conduction is increased and the efficiency of heat dissipation is therefore improved. The optical layer 172 covering the first contact layer 170 electrically insulates the second conductive layer 284 and the first metal layer 142 so the second conductive layer 284 can extend above the first metal layer 142 to increase the upper surface area of the second conductive layer 284. Path of heat dissipation and current conduction of the optoelectronic element 1700 is therefore increased to improve efficiency. When the upper surface areas of the first conductive layer 282 and the second conductive layer 284 are different, for instance the upper surface area of the second conductive layer 284 is larger than that of the first conductive layer 282, it is beneficial to the subsequent process such as alignment so the yield is increased. The first contact layer 170 can reflect the light generated from the optoelectronic unit 14 to increase the light extraction efficiency of the optoelectronic element 1700. The material of the first contact layer 170 can be the same as that of the first metal layer or the reflective layer.

Figure 18A:
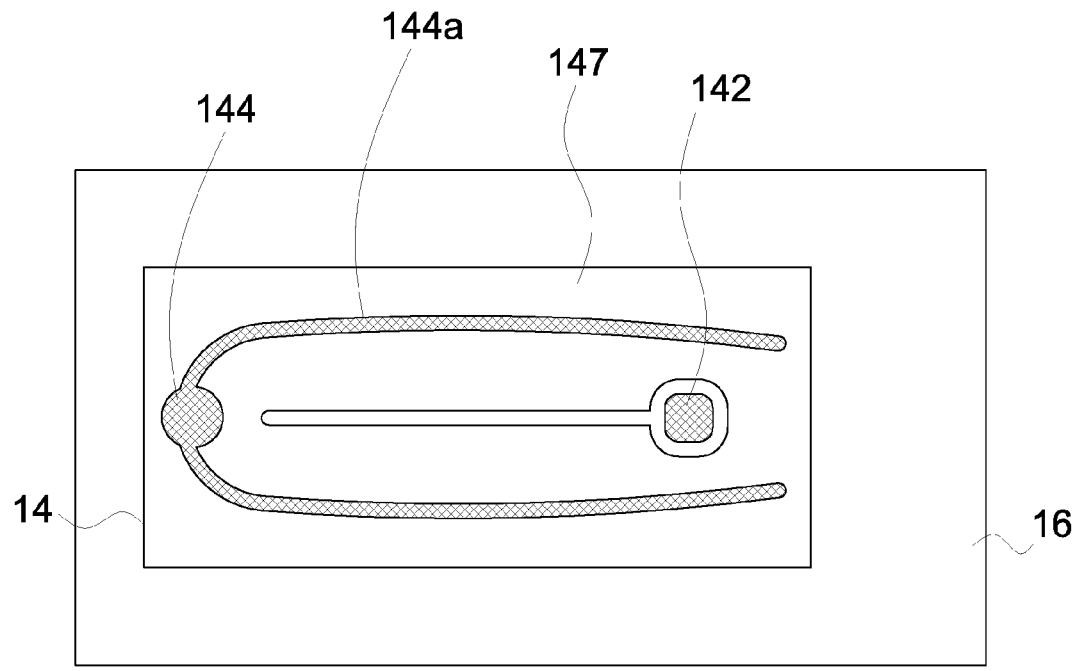
FIGS. 18A-18D illustrate flow charts of a manufacturing process of an optoelectronic element in accordance with another embodiment of the present application.
Figure 18B:
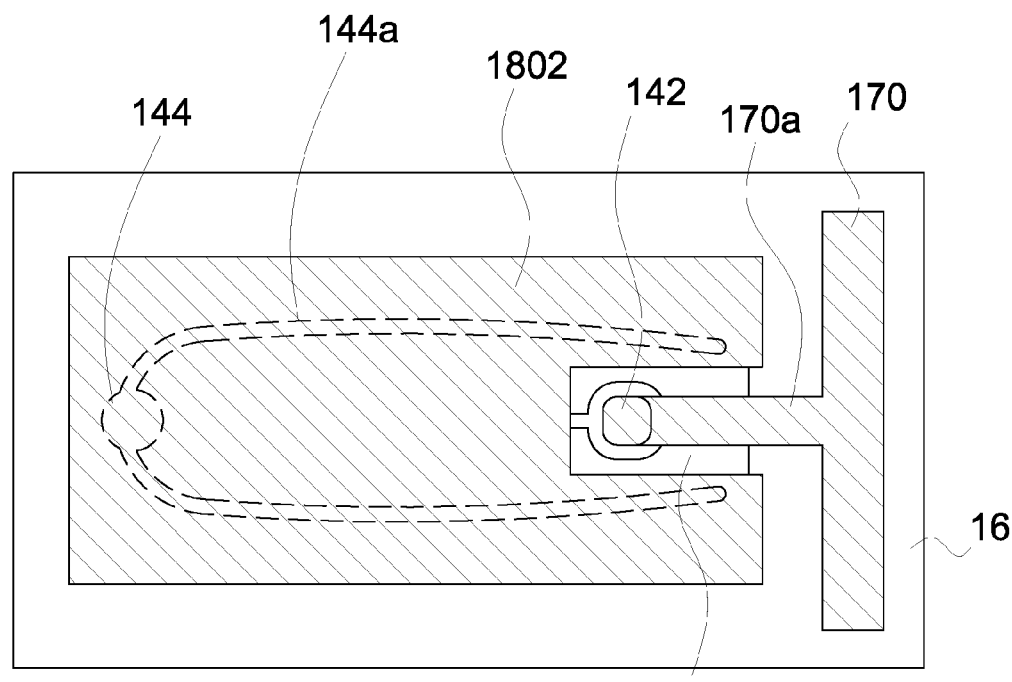
Figure 18C:
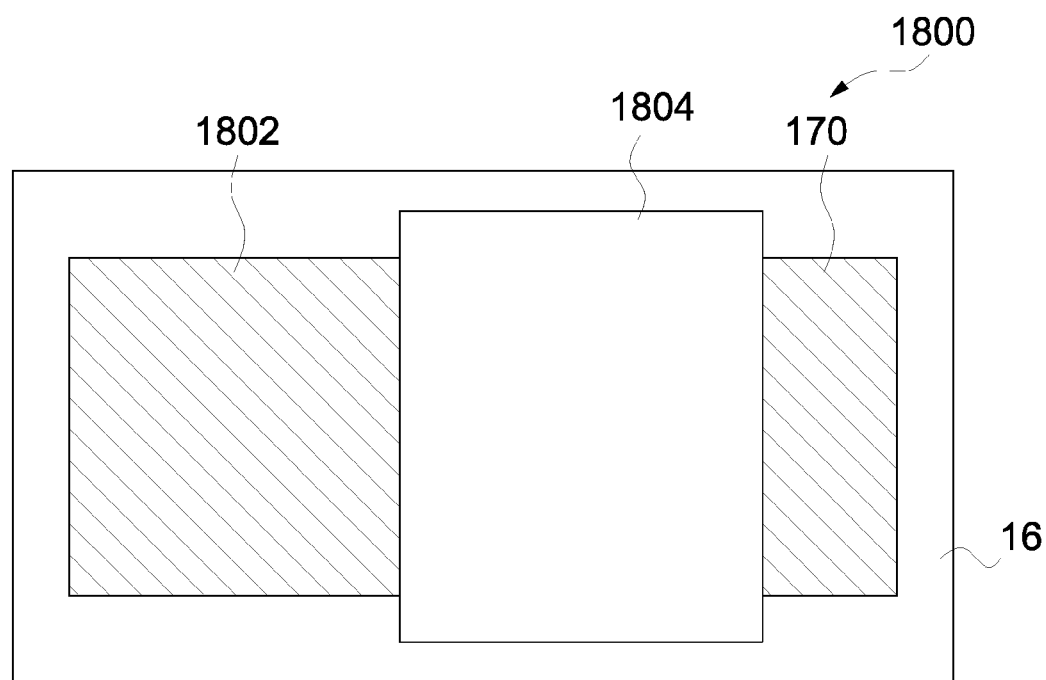
Figure 18D:
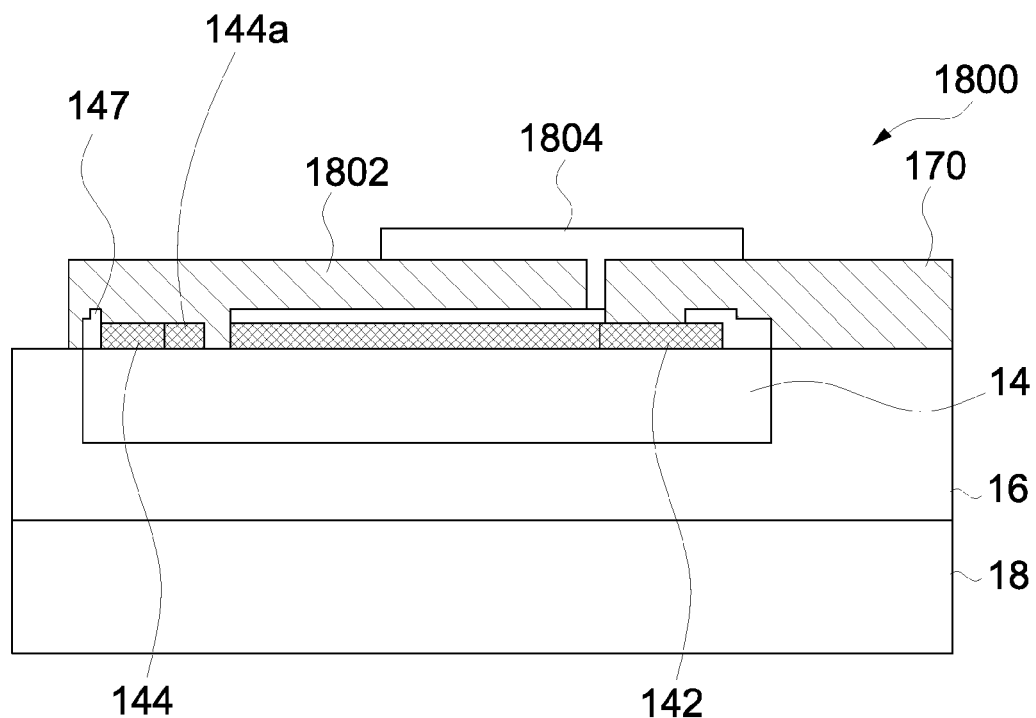

FIGS. 18A-18D disclose flow charts of a manufacturing process of an optoelectronic element 1800 in accordance with another embodiment of the present application. FIGS. 18A, 18B, and 18C are top views and FIG. 18D is a cross-sectional view of the optoelectronic element 1800. Referring to FIG. 18A, a portion of the passivation layer 147 of the optoelectronic unit 14 is removed to expose the first metal layer 142, the second metal layer 144, and the second extension part 144a. The first contact layer 170 is formed on the first transparent structure 16 and includes the connective part 170a extending toward the optoelectronic unit 14 and electrically connected with the first metal layer 142. A second contact layer 1802 is formed on the first transparent structure 16 and the passivation layer 147 and electrically connected with the second metal layer 144 and/or the second extension part 144a, wherein the first contact layer 170 is separated from the second contact layer 1802, as shown in FIG. 18B. A first isolating layer 1804 is formed on the first contact layer 170 and the second contact layer 1802 to form the optoelectronic element 1800, as shown in FIG. 18C. Referring to FIGS. 18A and 18D, the second metal layer 144 of the optoelectronic unit 14 includes the second extension part 144a to enhance the current spreading of the optoelectronic unit 14 and the light-emitting efficiency is improved. The second contact layer 1802 contacts with the second extension part 144a to increase the contact area between the second contact layer 1802 and the second metal layer 144. The path of heat dissipation and current conduction is increased and the efficiency of heat dissipation is therefore improved. The dimension such as length and width of the first isolating layer 1804 covering the first contact layer 170 and the second contact layer 1802 can be adjusted to change the exposed top surface areas of the first contact layer 170 and the second contact layer 1802 in another embodiment. The exposed top surface areas of the first contact layer 170 and the second contact layer 1802 can be the same or different. When the exposed upper surface areas of the first contact layer 170 and the second contact layer 1802 are different, for instance the exposed upper surface area of the second contact layer 1802 is larger than that of the first contact layer 170, it is beneficial to the subsequent process such as alignment so the yield is increased. Referring to FIG. 18D, the first isolating layer 1804 can be further formed between the first contact layer 170 and the second contact layer 1802 to electrically insulate them so the probability of short is decreased and the yield is increased. The material of the second contact layer 1802 can be the same as that of the first metal layer. The material of the first isolating layer 1804 can be the same as that of the first insulating layer or the optical layer.

Figure 19:
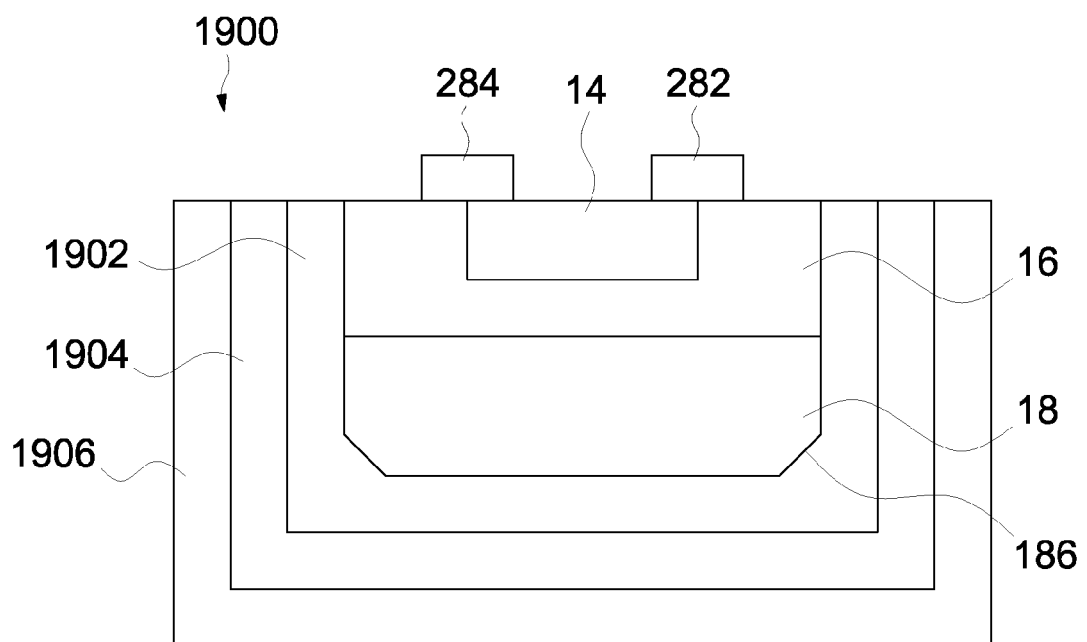
FIG. 19 illustrates a cross-sectional view of an optoelectronic element in accordance with another embodiment of the present application.

FIG. 19 illustrates a cross-sectional view of an optoelectronic element 1900 in accordance with another embodiment of the present application. The optoelectronic element 1900 includes the first conductive layer 282, the second conductive layer 284, the optoelectronic unit 14, and the first transparent structure 16 on the second transparent structure 18, wherein the second transparent structure 18 includes a bevel 186 between the bottom surface and the lateral surface of the second transparent structure 18 to process the light generated from the optoelectronic unit 14, for instance refracting or reflecting the light generated from the optoelectronic unit 14. The optoelectronic element 1900 further includes a first covering layer 1902 covering the second transparent structure 18; a second covering layer 1906 covering the first covering layer 1902; and a third wavelength-converting layer 1904 located between the first covering layer 1902 and the second covering layer 1906. The light from the optoelectronic unit 14 can be diffused by the third wavelength-converting layer 1904 to return to the optoelectronic unit 14. The diffused light can encounter total reflection at the interface between the second transparent structure 18 and the first covering layer 1902 so the absorption of the diffused light emitted to optoelectronic unit 14 is decreased and the light extraction efficiency of the optoelectronic element 1900 is increased. The third wavelength-converting layer 1904 includes wavelength-converting particles. A structure of the wavelength-converting particle can include quantum dot. The material of the wavelength-converting particle includes phosphor or a semiconductor material. The phosphor includes yttrium aluminum garnet (YAG), silicate garnet, vanadate garnet, alkaline earth metal silicate, alkaline earth metal sulfides, alkaline earth metal selenides, alkaline earth metal thiogallates, metal nitrides, metal oxo-nitrides, mixed molybdate-tungstate, mixed oxides, mixed glass phosphors, or the combination thereof. The semiconductor material contains more than one element selected from a group consisting of Ga, Al, In, As, P, N, Zn, Cd, and Se.

Figure 20A:
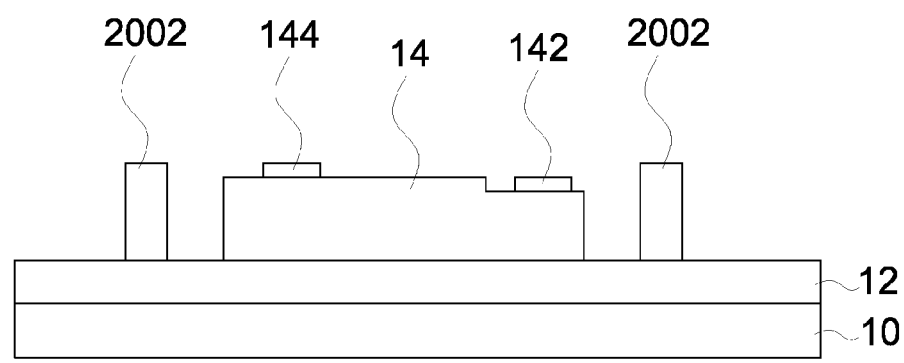
FIGS. 20A-20F illustrate flow charts of a manufacturing process of an optoelectronic element in accordance with another embodiment of the present application.
Figure 20B:
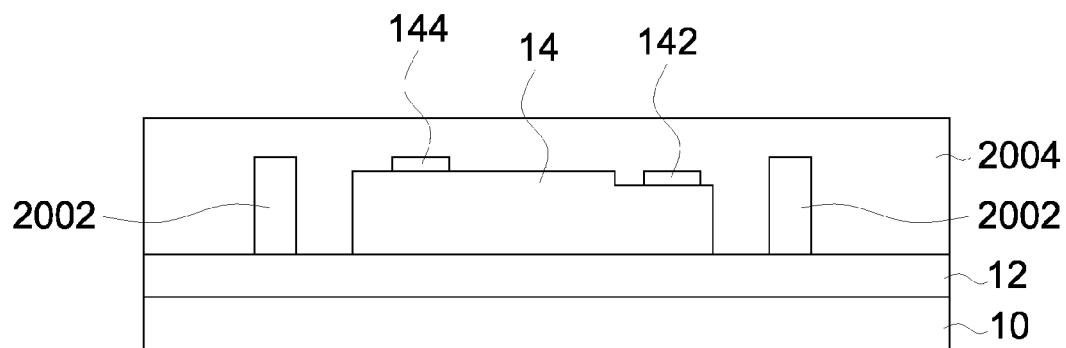
Figure 20C:
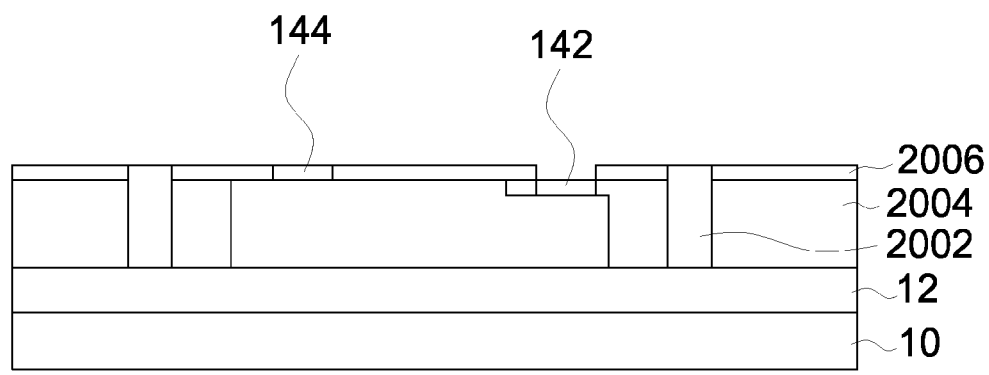
Figure 20D:
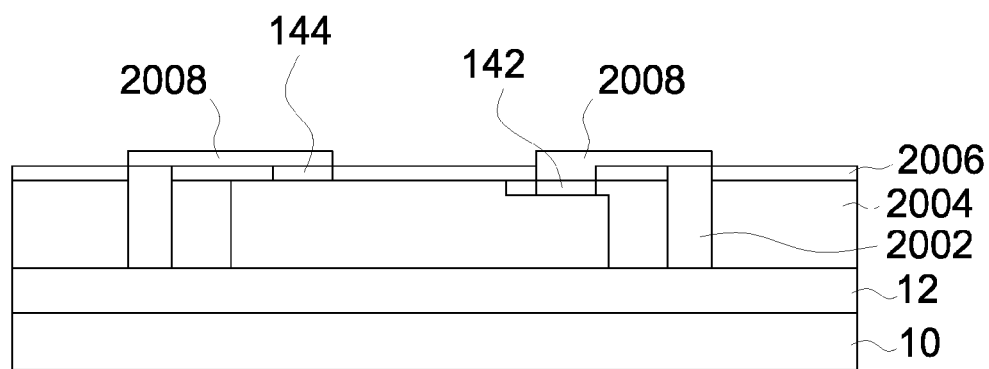
Figure 20E:
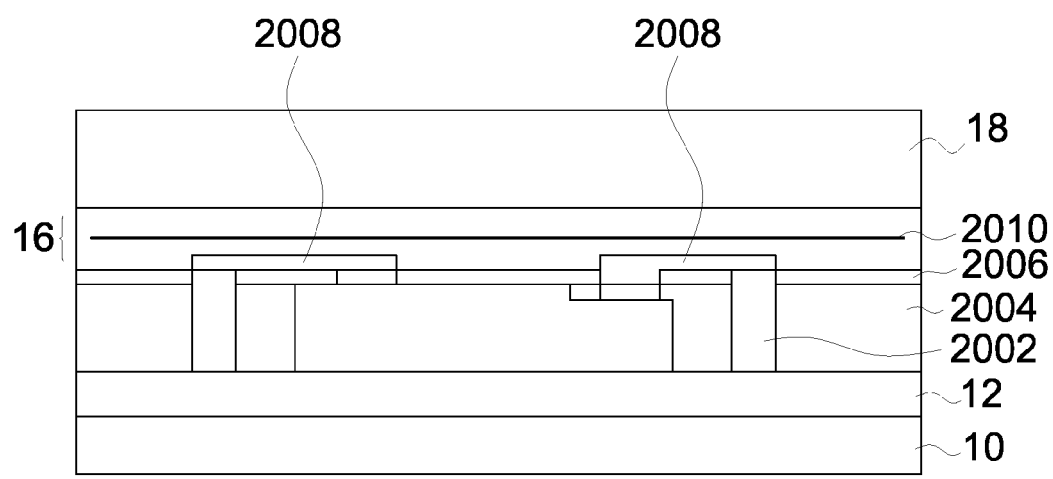
Figure 20F:
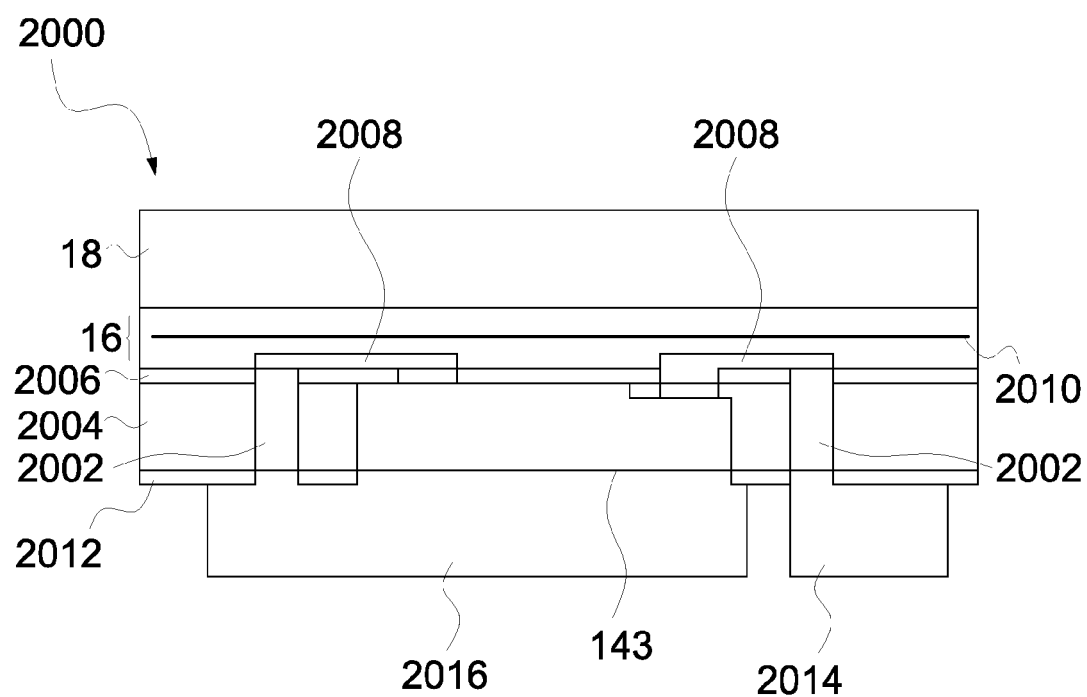

FIGS. 20A-20F disclose flow charts of a manufacturing process of an optoelectronic element 2000 in accordance with another embodiment of the present application. Referring to FIG. 20A, the bonding layer 12 is formed on the temporary carrier 10. The optoelectronic unit 14 is formed on the bonding layer 12, wherein the optoelectronic unit 14 includes the first metal layer 142 and the second metal layer 144. First lead structures 2002 are formed on the bonding layer 12 and separated from the optoelectronic unit 14, wherein the first lead structures 2002 can be located on the same side or the different sides of the optoelectronic unit 14. Referring to FIG. 20B, a first covering structure 2004 is formed on the bonding layer 12 and the optoelectronic unit 14 to cover the optoelectronic unit 14 and the first lead structures 2002, and is between the optoelectronic unit 14 and the first lead structures 2002. Referring to FIG. 20C, a portion of the first covering structure 2004 is removed to expose the first metal layer 142, the second metal layer 144, and the first lead structures 2002. A first isolating layer 2006 is formed on the first covering structure 2003 and exposes the first metal layer 142, the second metal layer 144, and the first lead structures 2002. Second lead structures 2008 are formed on the first isolating layer 2006, and electrically connect the first metal layer 142 and the second metal layer 144 with the first lead structures 2002 respectively, as shown in FIG. 20D. The first transparent structure 16 is formed on the first isolating layer 2006 and the second lead structures 2008, wherein the first transparent structure 16 includes a first wavelength-converting layer 2010 on the route where the light generated from the optoelectronic unit 14 passes. The second transparent structure 18 is formed on the first transparent structure 16, as shown in FIG. 20E. Referring to the FIG. 20 F, the temporary carrier 10 and the bonding layer 12 are removed. A second isolating layer 2012 is formed under the first covering structure 2004 and the optoelectronic unit 14, and exposes the first lead structures 2002 and a first bottom surface 143. A first conductive layer 2014 and a second conductive layer 2016 are formed under the second isolating layer 2012 to form the optoelectronic element 2000, wherein the first conductive layer 2014 and the second conductive layer 2016 are electrically connected with the first lead structures 2002 respectively. The second conductive layer 2016 can be direct contact with the first bottom surface 143 to improve the heat dissipation of the optoelectronic unit 14 and increasing the heat dissipation efficiency of the optoelectronic element 2000.

Figure 21:
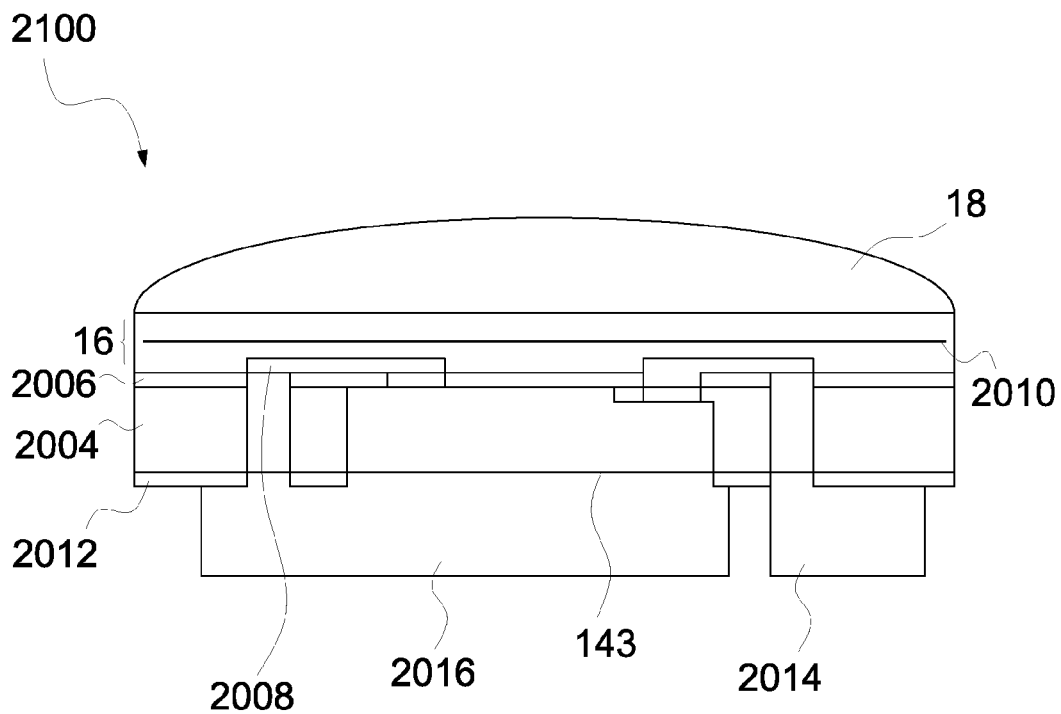
FIG. 21 illustrates a cross-sectional view of an optoelectronic element in accordance with another embodiment of the present application.
Figure 22:
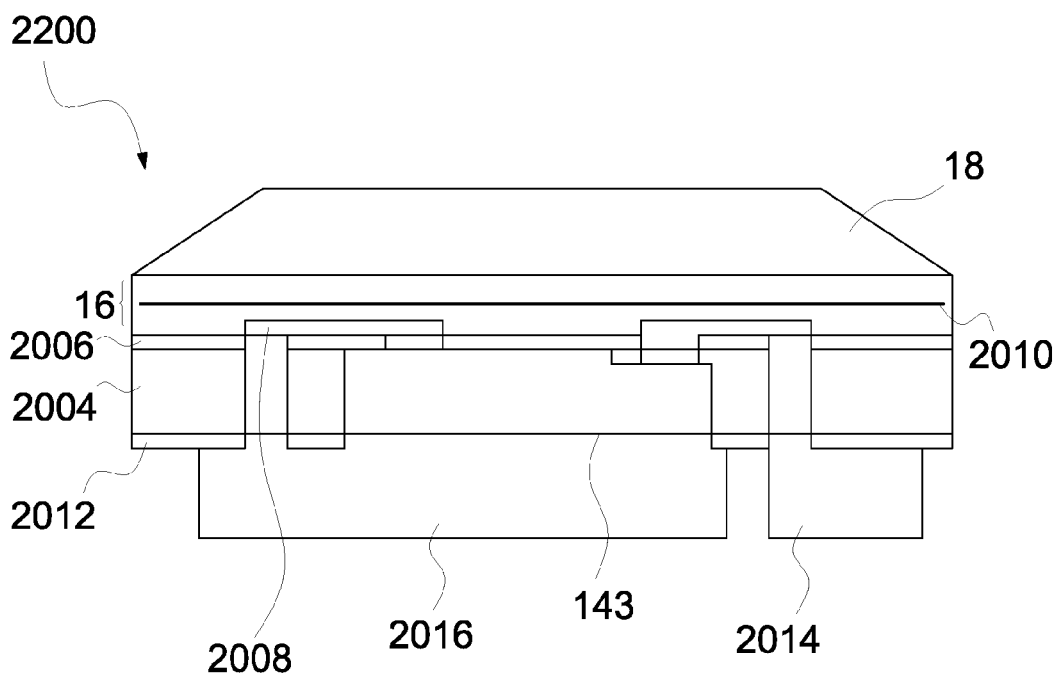
FIG. 22 illustrates a cross-sectional view of an optoelectronic element in accordance with another embodiment of the present application.

The first lead structures 2002 can conduct current and electrically connect the first metal layer 142 with the first conductive layer 2014 and the second metal layer 144 with the second conductive layer 2016. The reflectivity of the first lead structures 2002 is 70% to the light from the optoelectronic unit 14. The material of the first lead structures 2002 can be the same as that of the first conductive layer and the reflective layer. The first covering structure 2004 covers the optoelectronic unit 14 to fix and support the optoelectronic unit 14, enhances the mechanical strength of the optoelectronic element 2000, and electrically isolates the first lead structures 2002 and the optoelectronic unit 14. The first covering structure 2004 can be transparent to the light generated from the optoelectronic unit 14, and the material of the first covering structure 2004 can be different from or the same as that of the second transparent structure 18. The first isolating layer 2006 can isolate the first lead structures 2002 from the optoelectronic unit 14 and the material of the first isolating layer 2006 can be the same as that of the first insulating layer. The second isolating layer 2012 can isolate the first conductive layer 2014 from the second conductive layer 2016 and reflect or diffuse the light generated from the optoelectronic unit 14. The material of the second conductive layer 2016 can be the same as that of the first insulating layer or the optical layer. The second lead structures 2008 can conduct current, and electrically connect the first metal layer 142 with the first conductive layer 2014 and the second metal layer 144 with the second conductive layer 2016. The material of the second lead structures 2008 can be the same as that of the first conductive layer. Referring to FIG. 21, the shape of the second transparent structure 18 of an optoelectronic element 2100 can include arc in a cross-sectional view in another embodiment. In another embodiment, the second transparent structure of an optoelectronic element 2200 can be trapezoid in a cross-sectional view, as shown in FIG. 22. The shape of the second transparent structure 18 can be adjusted to change the optical field of optoelectronic element based on the need of the application. The shape of the second transparent structure 18 includes but is not limited to triangle, quarter circle, trapezoid, pentagon, or rectangle in the cross-sectional view. The shape of the first transparent structure 16 can be the same as or different from that of the second transparent structure 18.

Figure 23A:
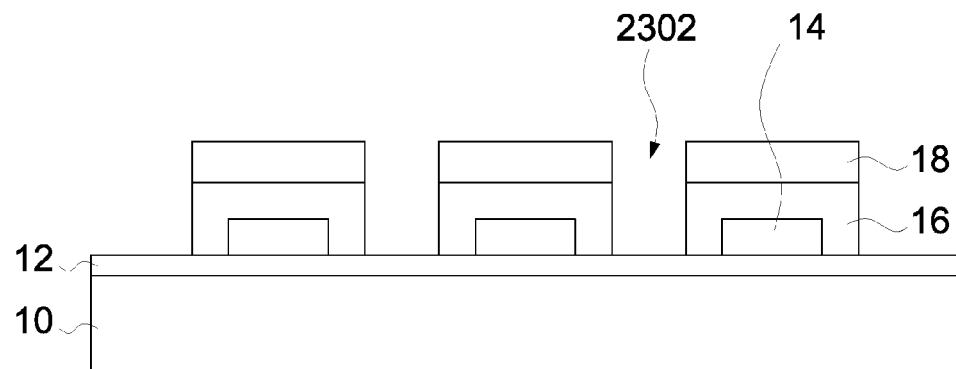
FIGS. 23A-23C illustrate flow charts of a manufacturing process of an optoelectronic element 2300 in accordance with another embodiment of the present application.
Figure 23B:
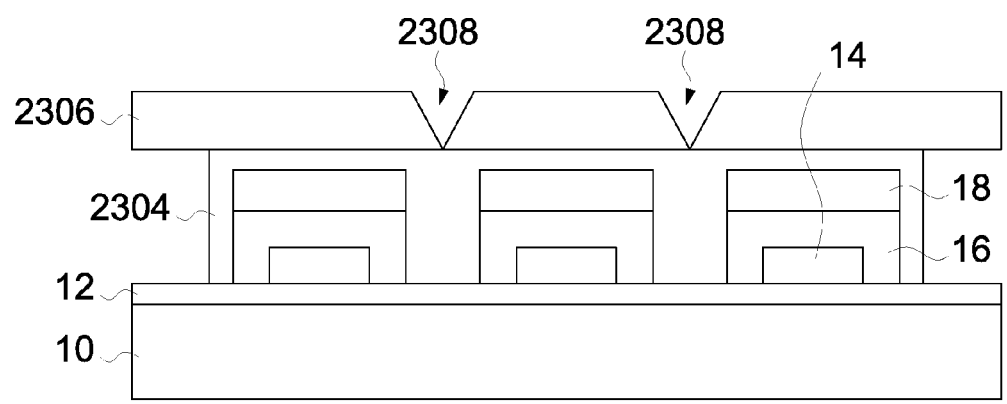
Figure 23C:
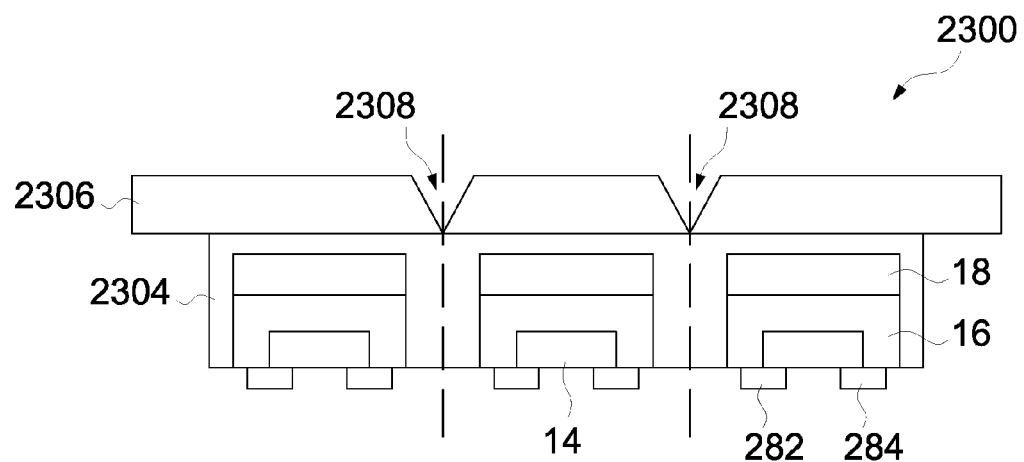

FIGS. 23A-23C disclose flow charts of a manufacturing process of an optoelectronic element 2300 in accordance with another embodiment of the present application. Referring to FIG. 23A, there is a wafer including the temporary carrier 10; the bonding layer 12 formed on the temporary carrier 10; the plurality of optoelectronic units 14 formed on the bonding layer 12; the first transparent structure 16 formed on the bonding layer 12 and the plurality of optoelectronic units 14; and the second transparent structure 18 formed on the first transparent structure 16, wherein there is a plurality of intervals 2302 between each two of the optoelectronic units 14. Referring to FIG. 23B, a fourth wavelength-converting layer 2304 is formed on the plurality of optoelectronic units 14, wherein the fourth wavelength-converting layer 2304 covers at least two sides of each optoelectronic unit 14. A transparent carrier 2306 is formed on the fourth wavelength-converting layer 2304. The transparent carrier 2306 can be precut to form a cavity 2308 between any two adjacent optoelectronic units 14. It benefits the subsequent process such as cutting. The shape of the cavity 2308 can be V shape in a cross-sectional view in another embodiment. Referring to FIG. 23C, the temporary carrier 10 and the bonding layer 12 are removed, and a plurality of conductive layers 282/284 is formed under the surfaces of the plurality of optoelectronic units 14 and the first transparent structure 16. The wafer can be cut along the cavities 2308 to form the plurality of optoelectronic elements 2300. Because there are the cavities 2308 formed on the transparent carrier 2306, the wafer can be separated easier. The material and the structure of the fourth wavelength-converting layer 2304 can be the same as that of the third wavelength-converting layer 1904. The material of the transparent carrier 2306 can be the same as that of the second transparent structure 18.

FIGS. 24A-24D disclose a manufacturing method of an optoelectronic element 2400 in accordance with another embodiment of the present application. This embodiment is a variation of the embodiment shown in FIGS. 23A-23C.

Figure 24A:
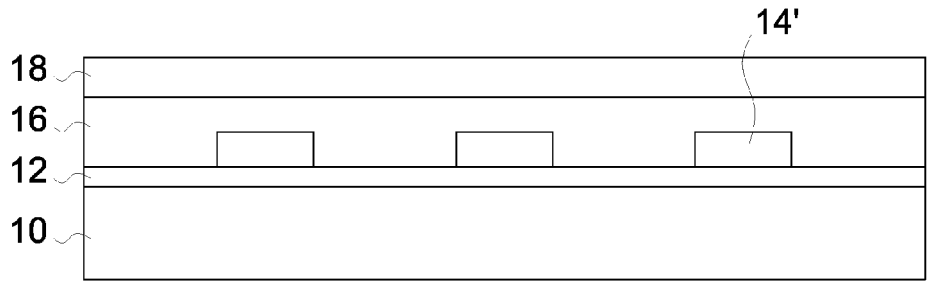
FIGS. 24A-24D illustrate a manufacturing method of an optoelectronic element 2400 in accordance with another embodiment of the present application.
Figure 24B:
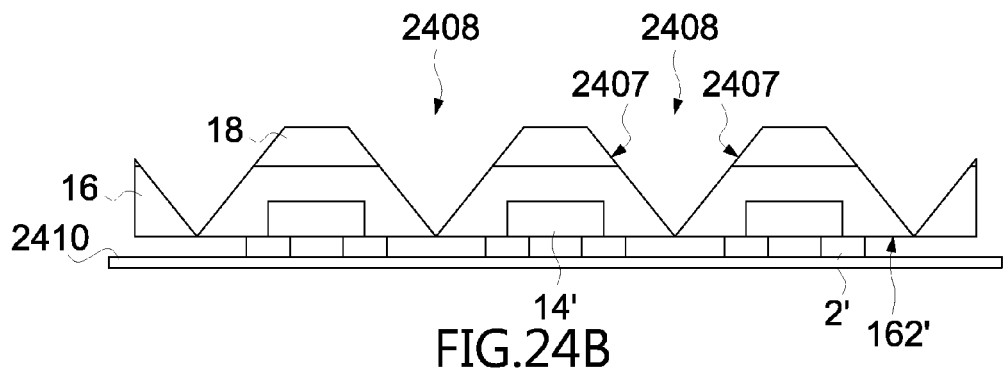
Figure 24C:
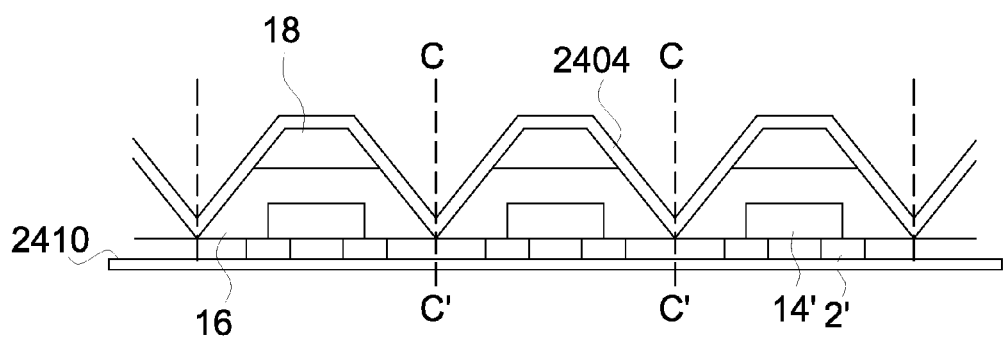
Figure 24D:
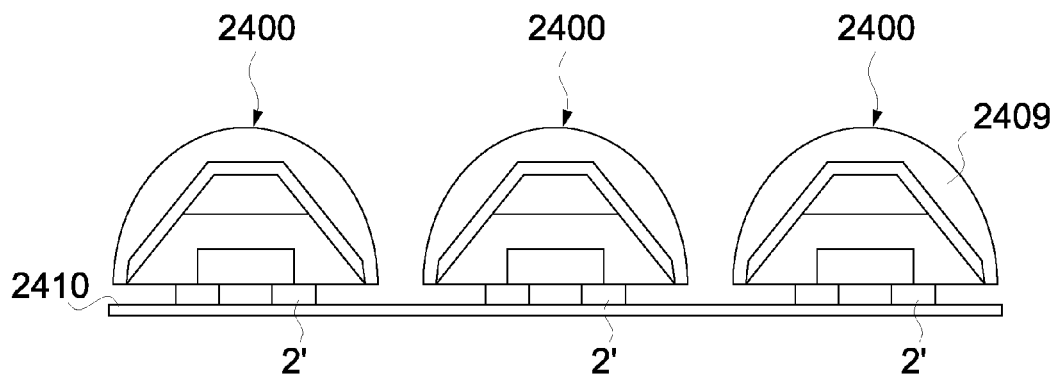

Referring to FIG. 24A, the manufacturing method includes the steps of providing a temporary carrier 10; forming a bonding layer 12 on the temporary carrier 10; and attaching a plurality of optoelectronic units 14' on temporary carrier 10 by the bonding layer 12. Then, a first transparent structure 16 is formed on the bonding layer 12 and covering the plurality of optoelectronic units 14'; and a second transparent structure 18 is formed on the first transparent structure 16. Referring to FIG. 24B, the temporary carrier 10 and the bonding layer 12 are removed after the second transparent structure 18 is formed, and a plurality of conductive structures 2' is formed on the surfaces of the plurality of optoelectronic units 14' uncovered by the first transparent structure 16 and the surface 162' of the first transparent structure 16. A support 2410, such as a tape, is adhered to the conductive structures 2' and/or the first transparent structure 16. The first transparent structure 16 and the second transparent structure 18 is then cut by a cut blade in the region between two adjacent optoelectronic units 14' to form cavities 2408 between two adjacent optoelectronic units 14'. In one example, the cut blade cuts through the second transparent structure 18 and the first transparent structure 16 such that the inclined sidewalls 2407 approximately reach the bottom surface of the first transparent structure 16, i.e., the surface of the first transparent structure 16 on which the conductive structures 2' is formed. In another example, the cut blade cuts through the second transparent structure 18 and cut into a portion of the first transparent structure 16. A portion of the first transparent structure 16 which is not cut is kept to connect two adjacent optoelectronic elements 14', and may be separated with the wavelength-converting layer 2404 by a breaking step described below. Each cavity 2408 has sidewalls 2407, and in the embodiment, when the sidewalls 2407 are inclined, the shape of each cavity 2408 can be V shape in a cross-sectional view so the outer profile of the stack of the first transparent structure 16 and the second transparent structure 18 is substantially a trapezoid in a cross-sectional view for enhancing light extraction. Referring to FIG. 24C, a wavelength-converting layer 2404 is conformably coated along the sidewalls 2407 and on the top surface of the second transparent structure 18. Then, a breaking step is performed along the cavities 2408 to separate the wavelength-converting layer 2404, and then expanding the support 2410 to expand the distance between two adjacent optoelectronic units 14' for an encapsulating material to encapsulate the optoelectronic units 14'. The encapsulating parts 2409 are formed by encapsulating the optoelectronic elements 14' with the encapsulating material. The encapsulating part 2409 covers the wavelength-converting layer 2404 and the optoelectronic units 14' except the bottom surface of the first transparent structure 16. The encapsulating part 2409 functions as an optical element, and the shape of the encapsulating part 2409 may be a dome shape to reduce the total internal reflection (TIR) at the interface between the encapsulating part 2409 and the environment, such as air. A material for the encapsulating part 2409 includes polymer material, such as epoxy resin or silicone. The optoelectronic elements 2400 are separated from each other after being removed from the support 2410 in FIG. 24D. In an alternative embodiment, the encapsulating part 2409 is formed one by one for each optoelectronic units 14' after the optoelectronic units 14' are separated from each other.

Figure 24E:
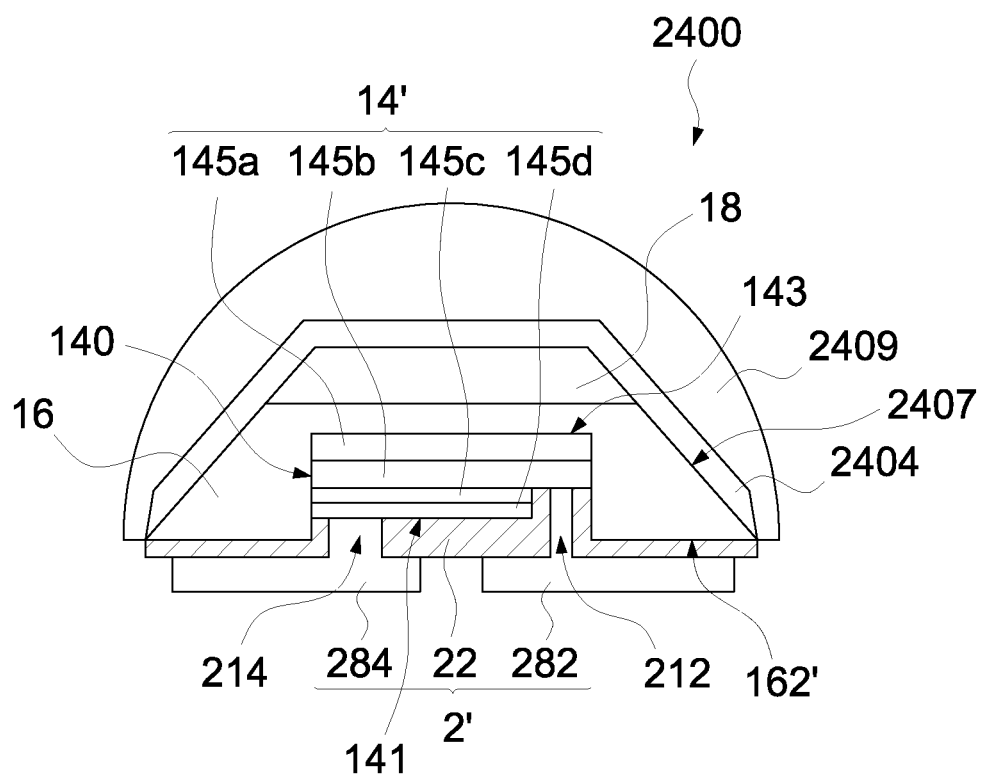
FIG. 24E illustrates a detailed structure of the optoelectronic element 2400 in accordance with an embodiment of the present application.

FIG. 24E illustrates a detailed structure of an embodiment of the optoelectronic element 2400 in accordance with an embodiment of the present application. The optoelectronic element 2400 includes an optoelectronic unit 14'; a first transparent structure 16 covering the optoelectronic unit 14'; a second transparent structure 18 on the first transparent structure 16; a wavelength-converting layer 2404 on the second transparent structure 18 and covering the first transparent structure 16 and the second transparent structure 18; a conductive structures 2' on the first surface 141 of the optoelectronic unit 14' and on the first transparent structure 16; and an encapsulating part 2409 covering the wavelength-converting layer 2404.

The optoelectronic unit 14' includes a substrate 145a, a first conductive layer 145b, an active layer 145c, and a second conductive layer 145d. The optoelectronic unit 14' includes a top surface 141, a bottom surface 143 opposite to the top surface 141, and a lateral surface 140 between the top surface 141 and the bottom surface 143. The first transparent structure 16 is on the optoelectronic unit 14' and covering the lateral surface 140 and the bottom surface 143. The second transparent structure 18 is on the first transparent structure 16, and the outer profile of the stack of the first transparent structure 16 and the second transparent structure 18 is substantially a trapezoid in a cross-sectional view. The wavelength-converting layer 2404 is on the second transparent structure 18 and covering the first transparent structure 16 and the second transparent structure 18 wherein a sidewall of the second transparent structure 18 and a sidewall of the first transparent structure 16 are inclined, and together forms a continuous inclined sidewall 2407. The material the wavelength-converting layer 2404 includes the materials of the third wavelength-converting layer 1904. The conductive structures 2' includes a first insulating layer 22, a first conductive layer 282, and second conductive layer 284. The first insulating layer 22 is on the first top surface 141 of the optoelectronic unit 14' and the surface 162' of the first transparent structure 16. The material of the first insulating layer 22 can be the same as or different from that of the first transparent structure 16. A first opening 212 and a second opening 214 is through the first insulating layer 22 to expose the second conductive type layer 145d and the first conductive type layer 145b respectively. The first conductive layer 282 is on the first insulating layer 22 and electrically connects to the first conductive type layer 145b via the first opening 212. The second conductive layer 284 is on the first insulating layer 22 and electrically connects to the second conductive type layer 145d via the second first opening 214. The encapsulating part 2409 encapsulates the wavelength-converting layer 2404 and exposes the bottom surface of the first transparent structure 16. In one example, the refractive index of the first transparent structure 16, the second transparent structure 18, and the encapsulating part 2409 is gradually changed, for example, gradually decreased to the environment for enhancing light extraction efficiency. For example, the refractive index of the first transparent structure 16 is larger than that of the second transparent structure 18, and the refractive index of the second transparent structure 18 is larger than that of the encapsulating part 2409. When the optoelectronic element 2400 is mounted to a sub-mount with the first top surface 141 of the optoelectronic unit 14' facing the sub-mount, the wavelength-converting layer 2404 covers the bottom surface 143 and the lateral surface 140 of the optoelectronic unit 14' fully to assure that the light generated from the active layer 145c is transmitted outside the optoelectronic element 2400 after passing through the wavelength-converting layer 2404. Therefore, the light from the optoelectronic element 2400 has uniform color distribution.

Figure 13:
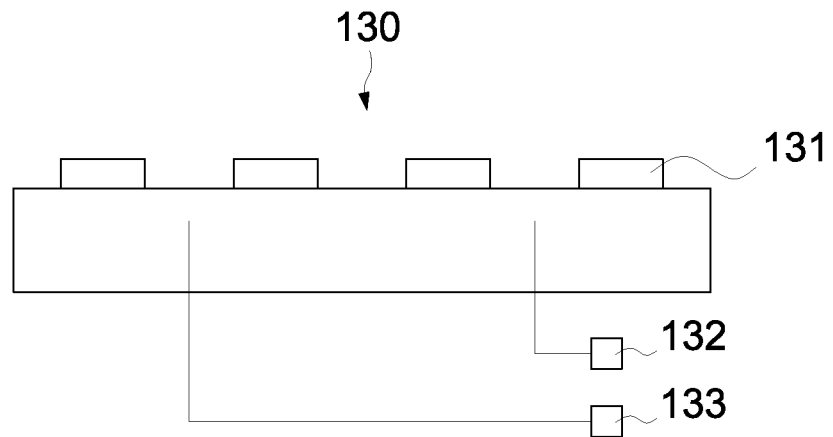
FIG. 13 illustrates a cross-sectional view of a light-generating device in accordance with another embodiment of the present application.

FIG. 13 illustrates a schematic diagram of a light-generating device 130. The light-generating device 130 includes the light-emitting element of any one of the foregoing embodiments of the present application. The light-generating device 130 can be an illumination device such as a street light, a lamp of vehicle, or an illustration source for interior. The light-generating device 130 can be also a traffic sign or a backlight of a backlight module of an LCD. The light-generating device 130 includes a light source 131 adopting any foregoing light-emitting devices; a power supplying system 132 providing current to the light source 131; and a control element 133 controlling the power supplying system 132.

Figure 14:
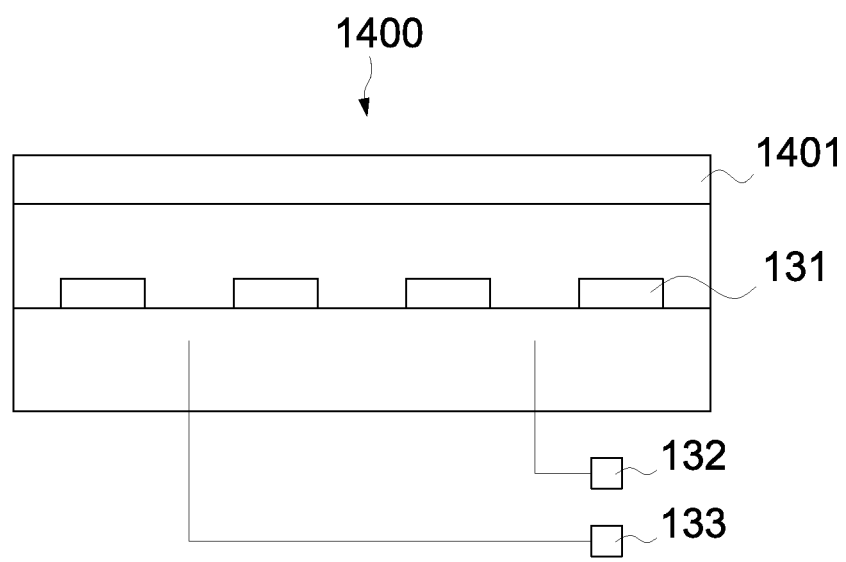
FIG. 14 illustrates a cross-sectional view of a backlight module in accordance with another embodiment of the present application.
Figure 15:
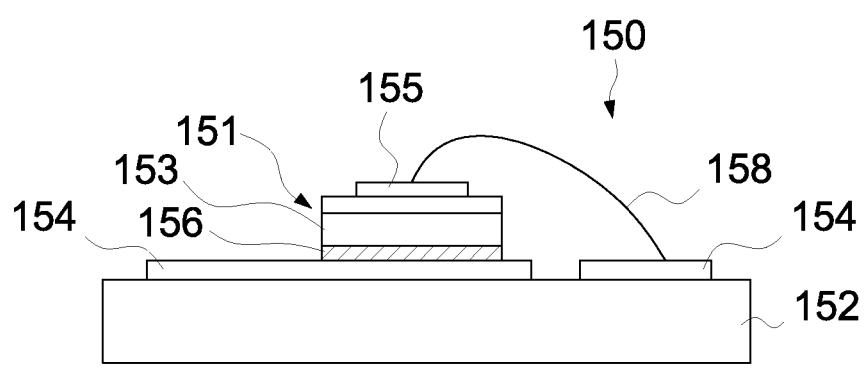
FIG. 15 illustrates a cross-sectional view of a conventional light-emitting device.

FIG. 14 illustrates a schematic diagram of a back light module 140. The back light module 140 includes the light-generating device 130 of the foregoing embodiment and an optical element 141. The optical element 141 can process the light generated by the light-generating device 130 for LCD application, such as scattering the light generated from the light-generating device 130.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents

What is claimed is:

1. An optoelectronic element comprising:
   an optoelectronic unit having a virtual central line in a top view, a side surface, a top surface, and a bottom surface;
   a first metal layer having a first extension portion;
   a second metal layer formed on the top surface, and having a second extension portion crossing over the virtual central line and extending to the first metal layer;
   a transparent structure covering the side surface and the bottom surface without covering the top surface; and
   an optical layer covering the first extension portion, the second extension portion, and the transparent structure.

2. The optoelectronic element of claim 1, further comprising a passivation layer formed on the second extension portion without covering a side surface of the second metal layer.

3. The optoelectronic element of claim 1, wherein the optical layer comprises epoxy or silicone.

4. The optoelectronic element of claim 2, wherein the passivation layer has a side surface covered by the optical layer.

5. The optoelectronic element of claim 1, further comprising a conductive layer directly contacting the first metal layer.

6. The optoelectronic element of claim 5, wherein the conductive layer overlaps the first extension portion and the second extension portion.

7. The optoelectronic element of claim 5, wherein the transparent structure has a portion overlapping the conductive layer.

8. The optoelectronic element of claim 1, wherein the transparent structure comprises a transparent layer and a wavelength-converting layer.

9. The optoelectronic element of claim 8, wherein the wavelength-converting layer comprises quantum dot or phosphor.

10. The optoelectronic element of claim 1, wherein the first extension portion crosses over the virtual central line and extends toward the second metal in the top view.

11. The optoelectronic element of claim 1, wherein the transparent structure has a flat bottom surface.

12. The optoelectronic element of claim 1, wherein the second metal layer comprises a base portion wider than the extension portion.

13. The optoelectronic element of claim 1, wherein the optical layer comprises a plurality of particles.

* * * * *

UNITED STATES PATENT AND TRADEMARK OFFICE
CERTIFICATE OF CORRECTION

PATENT NO. : 9,893,244 B2  
APPLICATION NO. : 14/858477  
DATED : February 13, 2018  
INVENTOR(S) : Cheng-Nan Han et al.

Page 1 of 1

It is certified that error appears in the above-identified patent and that said Letters Patent is hereby corrected as shown below:

On the Title Page

Item (63), the Related U.S. Application Data information which reads:
"Continuation of application No. 13/886,083, filed on May 2, 2013, now Pat. No. 9,142,740, which is a continuation-in-part of application No. 11/674,371, filed on Feb. 13, 2017, now abandoned."
Should read:
"Continuation of application No. 13/886,083, filed on May 2, 2013, now Pat. No. 9,142,740, which is a continuation-in-part of application No. 11/674,371, filed on Feb. 13, 2007, now abandoned."

Signed and Sealed this  
Tenth Day of April, 2018

Andrei Iancu  
*Director of the United States Patent and Trademark Office*